(12) United States Patent
Kobayashi et al.

(10) Patent No.: US 9,197,829 B2
(45) Date of Patent: Nov. 24, 2015

(54) SOLID STATE IMAGING DEVICE AND ELECTRONIC APPARATUS

(71) Applicant: Sony Corporation, Tokyo (JP)

(72) Inventors: Shoji Kobayashi, Kanagawa (JP); Yoshiharu Kudoh, Kanagawa (JP); Takuya Sano, Kanagawa (JP)

(73) Assignee: SONY CORPORATION (JP)

( * ) Notice: Subject to any disclaimer, the term of this patent is extended or adjusted under 35 U.S.C. 154(b) by 0 days.

(21) Appl. No.: 14/057,542

(22) Filed: Oct. 18, 2013

(65) Prior Publication Data

US 2014/0043512 A1    Feb. 13, 2014

Related U.S. Application Data

(63) Continuation of application No. 13/227,851, filed on Sep. 8, 2011, now Pat. No. 8,587,040.

(30) Foreign Application Priority Data

Sep. 15, 2010  (JP) .................................. 2010-206890

(51) Int. Cl.
| | | |
|---|---|---|
| *H01L 31/062* | (2012.01) | |
| *H04N 5/374* | (2011.01) | |
| *H04N 5/369* | (2011.01) | |
| *H01L 27/146* | (2006.01) | |

(52) U.S. Cl.
CPC ............ *H04N 5/374* (2013.01); *H01L 27/1464* (2013.01); *H01L 27/14623* (2013.01); *H01L 27/14636* (2013.01); *H04N 5/369* (2013.01); *H01L 27/14609* (2013.01); *H01L 27/14645* (2013.01)

(58) Field of Classification Search
CPC ............... H01L 27/14623; H01L 27/14636; H01L 27/1464; H01L 27/14609; H01L 27/14645; H04N 5/374; H04N 5/369
USPC ......... 257/291, 292, 294, 222, 223, 432, E31, 257/127, E31.001; 438/48, 49, 70, 57, 60
See application file for complete search history.

(56) References Cited

U.S. PATENT DOCUMENTS

| 7,495,206 B2 * | 2/2009 | Park ........................... 250/214.1 |
| 2006/0146233 A1 * | 7/2006 | Park ................................. 349/95 |

FOREIGN PATENT DOCUMENTS

| JP | 2002-043556 | 2/2002 |
| JP | 2004-356537 | 12/2004 |
| JP | 2006-191081 | 7/2006 |

(Continued)

OTHER PUBLICATIONS

Official Action (no English translation available) for Japanese Patent Application No. 2010-206890 mailed Dec. 24, 2014, 4 pages.

*Primary Examiner* — Thinh T Nguyen
(74) *Attorney, Agent, or Firm* — Sheridan Ross P.C.

(57) ABSTRACT

A solid state imaging device including: a pixel region that is formed on a light incidence side of a substrate and to which a plurality of pixels that include photoelectric conversion units is arranged; a peripheral circuit unit that is formed in a lower portion in the substrate depth direction of the pixel region and that includes an active element; and a light shielding member that is formed between the pixel region and the peripheral circuit unit and that shields the incidence of light, emitted from an active element, to the photoelectric conversion unit.

12 Claims, 13 Drawing Sheets

(56) References Cited

FOREIGN PATENT DOCUMENTS

| JP | 2007-013089 | 1/2007 |
|---|---|---|
| JP | 2009-170944 | 7/2009 |
| JP | 2009-290000 | 12/2009 |
| JP | 2010-109295 | 5/2010 |

* cited by examiner

151

21

27

81

81

SOLID STATE IMAGING DEVICE AND ELECTRONIC APPARATUS

CROSS-REFERENCE TO RELATED APPLICATIONS

This application is a continuation of U.S. patent application Ser. No. 13/227,851, filed Sep. 8, 2011, which claims priority to Japanese Patent Application Serial No. JP 2010-206890, filed in the Japan Patent Office on Sep. 15, 2010, the entire disclosures of which are hereby incorporated herein by reference.

BACKGROUND

The present disclosure relates to a solid state imaging device and an electronic apparatus such as a camera that is provided with the solid state imaging device.

In recent years, electronic cameras have become increasingly widespread, and demand for solid state imaging devices (image sensors) that are the central components thereof has been growing further. In terms of performance, there are ongoing technical developments for realizing improvements in image quality and functionality. Meanwhile, video cameras and mobile cameras, as well as mobile phones, PDAs (Personal Digital Assistants), laptop personal computers, and the like have been increasingly popularized, attempts to make solid state imaging devices and also the components thereof smaller, lighter, and thinner to facilitate transportation, and attempts to reduce costs in order to expand their adoption, are becoming important.

In the related art, a solid state imaging device, for example, a MOS type solid state imaging device includes photoelectric conversion units, an amplification circuit, and a multilayer wiring layer formed on a first main surface (acceptance surface) side on a silicon substrate, and a chip with an on-chip micro-lens or a color filter formed thereon. A solid state imaging device is configured by affixing a cover glass to a first main surface of the chip by a spacer such as an adhesive and forming a terminal on a second main surface side of the chip.

Chips that are equipped with a signal processing circuit for processing an output image are connected to the solid state imaging device. The processing performed by the signal processing circuit has been diversifying along with the increasing number of functions of the solid state imaging device.

There are many steps being taken to continue the miniaturization of such a plurality of functions and a plurality of chips. For example, miniaturization is performed by including a plurality of chips in one package using a SIP (Silicon in Package) technique. In such a case, although it is an advantage that miniaturization is able to be realized by combining existing chips, there is an adverse effect that, since transmission distances for connecting the chips become long and a high-speed connection becomes difficult, it is difficult to realize a high-speed action.

On the other hand, a solid state imaging device in which a light shielding member that screens emitted light caused by impact ionization occurring in an output circuit is arranged between a source follower circuit that becomes an output circuit and photoelectric conversion units which are formed within the same plane of a semiconductor substrate is shown in Japanese Unexamined Patent Application Publication No. 2002-43556.

SUMMARY

With regard to the solid state imaging device, efforts to realize high-speed transmission of the signal by affixing and joining each of a plurality of chips have been begun. However, in such a case, since the photoelectric conversion units and a peripheral circuit unit are formed in close proximity, problems arise that are unique to the solid state imaging device. Since the photoelectric conversion units treat miniscule carriers (for example, electrons) as signals, the influence of heat or electromagnetic fields from circuits in the vicinity is easily mixed in as noise. In addition, miniscule hot carrier luminescence that is emitted from transistors, which seldom causes a problem in the usual circuit action of the transistors, also has a large influence on the characteristics of the solid state imaging device.

The hot carrier luminescence is luminescence that is emitted by a generation and recombination between electrons, which appear when carriers that are accelerated between a source and a drain are ionized by collision at the drain end, and positive holes, or by a transition in the state of either. The luminescence is regularly emitted, albeit in a miniscule amount, even with transistors, the characteristics of which pose no problems. Since the luminescence is scattered in all directions, the influence thereof is very small when further away from the transistors. However, in a case when the photoelectric conversion units and circuits configured by the transistors are arranged very closely, a considerable number of photons are injected into the photoelectric conversion units without much diffusion of the luminescence.

Due to the inadequate diffusion, the luminescence distribution of hot carrier luminescence caused by a difference in the transistor arrangement density or the active rate is projected onto an image as two-dimensional information. Therefore, light shielding for restricting the injection amount of the hot carrier luminescence into the photoelectric conversion units to be at a detection limit or lower becomes important.

In addition, a protection circuit for protecting circuit elements from a surge voltage is built into the peripheral circuits. With a protection diode that configures the protection circuit, a luminescence phenomenon occurs when a reverse bias voltage is applied when acting and when in a broken down state. If such luminescence enters the photoelectric conversion units, similarly to the description above, a large influence is exerted on the characteristics of the solid state imaging device.

It is desirable to provide a solid state imaging device in which a pixel region and peripheral circuits are provided in close proximity above and below the other within a substrate, where image quality is improved by suppressing the infiltration of the photoelectric conversion units by light emitted from an active element such as a transistor or a diode that is acting.

It is desirable to provide an electronic apparatus such as a camera that includes such a solid state imaging device.

A solid state imaging device according to an embodiment of the disclosure includes a pixel region that is formed on a light incidence side of a substrate and to which a plurality of pixels that include photoelectric conversion units is arranged, and a peripheral circuit unit that is formed in a lower portion in the substrate depth direction of the pixel region and that includes an active element. Furthermore, the embodiment of the disclosure includes a light shielding member that is formed between the pixel region and the peripheral circuit unit and that shields the incidence of light, emitted from an active element, to the photoelectric conversion units.

In the solid state imaging device according to the embodiment of the disclosure, the pixel region and the peripheral circuit unit are three-dimensionally arranged above and below the other within a substrate. Since a light shielding member is provided between the three-dimensionally arranged pixel region and the peripheral circuit unit, even if the pixel region and the peripheral circuits are arranged in close proximity, light that is emitted from the active element when the active element of the peripheral circuit unit is acting is shielded by the light shielding member, and infiltration of light into the photoelectric conversion units is suppressed.

An electronic apparatus according to another embodiment of the disclosure includes a solid state imaging device, an optical system that guides incident light to photoelectric conversion units of the solid state imaging device, and a signal processing circuit that processes an output signal of the solid state imaging device. The solid state imaging device includes a pixel region that is formed on a light incidence side of a substrate and to which a plurality of pixels that include photoelectric conversion units is arranged, and a peripheral circuit unit that is formed in a lower portion in the substrate depth direction of the pixel region and that includes an active element. Furthermore, the embodiment of the disclosure includes a light shielding member that is formed between the pixel region and the peripheral circuit unit and that shields the incidence of light, emitted from an active element when the active element is acting, to the photoelectric conversion units.

Since an electronic apparatus according to the embodiment of the disclosure includes a solid state imaging device according to the embodiment of the disclosure described above, in the solid state imaging device, light that is emitted from the active element when the active element of the peripheral circuit unit is acting is shielded by the light shielding member, and infiltration of light into the photoelectric conversion units is suppressed.

According to a solid state imaging device according to the embodiment of the disclosure, since light that is emitted from the active element when the active element of the peripheral circuit unit is acting is shielded by the light shielding member, and infiltration of light into the photoelectric conversion units is suppressed, the image quality of the solid state imaging device is able to be improved.

According to an electronic apparatus according to the embodiment of the disclosure, although light is emitted when an active element of the peripheral circuit unit of the solid state imaging device is acting, since infiltration of light to the photoelectric conversion units is suppressed by the light shielding member, the image quality of the solid state imaging device is improved. In such a manner, an electronic apparatus that is able to obtain a high image quality is able to be provided.

DETAILED DESCRIPTION OF EMBODIMENTS

The embodiments of the disclosure will be described below with reference to the drawings. Here, the description will be given in the following order.

1. Outline Configuration Example of MOS Type Solid state Imaging Device Applied to Embodiment of Disclosure 2. First Embodiment (Configuration Example of Solid State Imaging Device)

3. Second Embodiment (Configuration Example of Solid State Imaging Device)

4. Third Embodiment (Configuration Example of Solid State Imaging Device)

5. Fourth Embodiment (Configuration Example of Solid State Imaging Device)

6. Fifth Embodiment (Configuration Example of Solid State Imaging Device)

7. Sixth Embodiment (Configuration Example of Solid State Imaging Device)

8. Seventh Embodiment (Configuration Example of Solid State Imaging Device)

9. Eighth Embodiment (Configuration Example of Solid State Imaging Device)

10. Ninth Embodiment (Configuration Example of Solid State Imaging Device)

11. Tenth Embodiment (Configuration Example of Solid State Imaging Device)

12. Eleventh Embodiment (Configuration Example of Electronic Apparatus)

Figure 1:
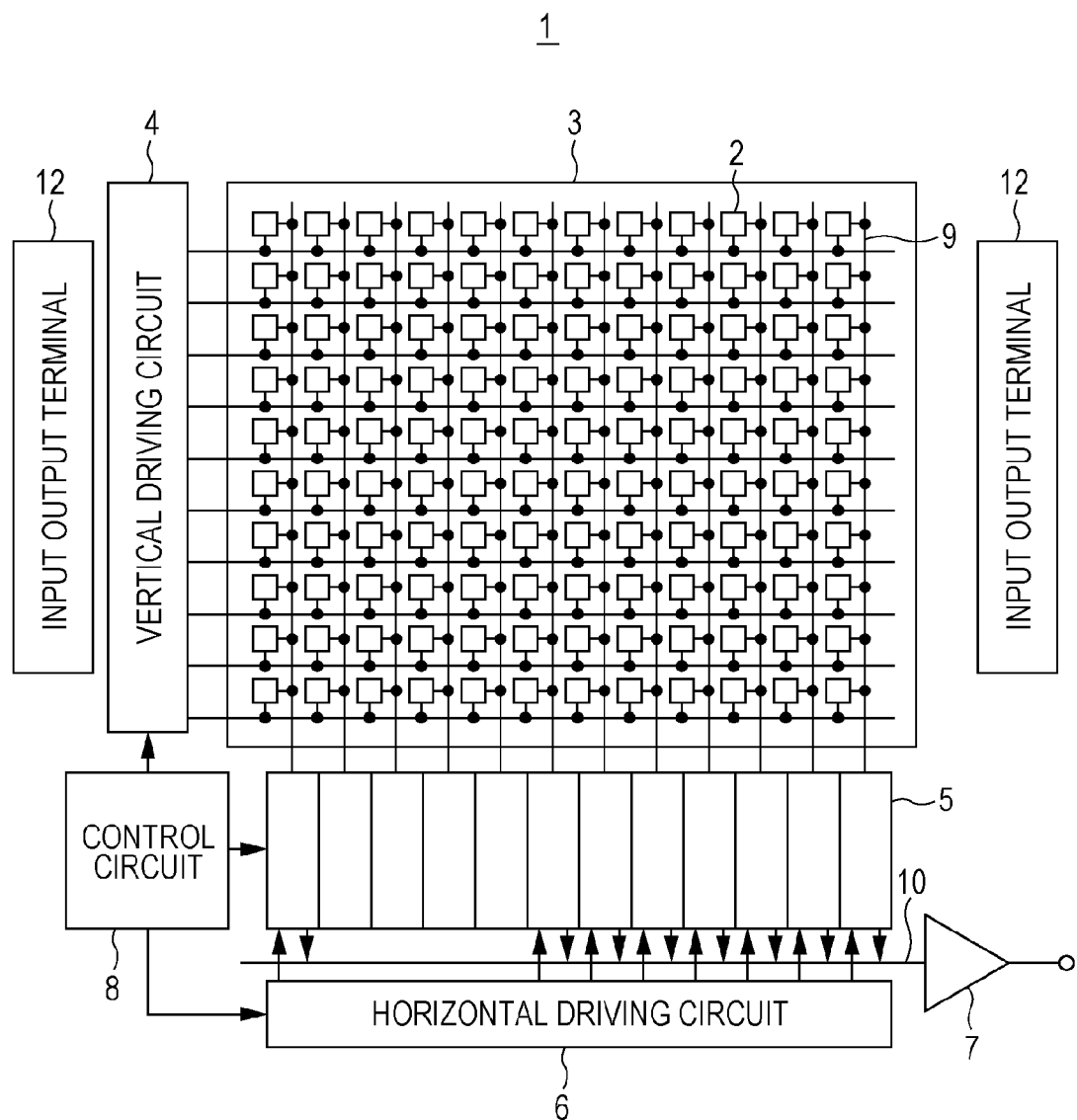
FIG. 1 is an outline configuration example diagram that illustrates an example of a MOS type solid state imaging device that is applied to an embodiment of the disclosure.

1. Outline Configuration Example of MOS Type Solid State Imaging Device Applied to Embodiment of Disclosure FIG. 1 illustrates an outline configuration of a MOS type solid state imaging device that is applied to an embodiment of the disclosure. The MOS type solid state imaging device is applied to the solid state imaging device of each embodiment. A solid state imaging device 1 of the present example is configured to include a pixel region (a so-called pixel array) 3 in which a plurality of pixels 2 including photoelectric conversion units is systematically arranged in a two-dimensional array form on a semiconductor substrate (not shown in the drawings), for example, a silicon substrate, and a peripheral circuit unit. A pixel 2 is formed to include, for example, a photodiode that is a photoelectric conversion unit, and a plurality of pixel transistors (so-called MOS transistors). The plurality of pixel transistors is able to be composed of, for example, three transistors of a transfer transistor, a reset transistor, and an amplification transistor. In addition, a selection transistor may be added to configure the plurality of pixel transistors using four transistors. Since the equivalent circuits of a unit pixel are the same as usual, the description thereof will be omitted. The pixel 2 is able to be configured as one unit pixel. Further, the pixel 2 is able to have a shared pixel structure. The shared pixel configuration is a structure in which a plurality of photodiodes shares a floating diffusion that configures the transfer transistor and transistors other than the transfer transistor.

The peripheral circuit unit is configured to include a vertical driving circuit 4, a column signal processing circuit 5, a horizontal driving circuit 6, an output circuit 7, and a control circuit 8.

The control circuit 8 receives an input clock and data that instructs an action mode or the like, and outputs data such as internal information of the solid state imaging device or the like. That is, in the control circuit 8, a clock signal or a control signal that is the standard of the actions or the like of the vertical driving circuit 4, the column signal processing circuit 5, and the horizontal driving circuit 6 is generated based on a vertical synchronization signal, a horizontal synchronization signal, and a master clock. Further, such signals are input to the vertical driving circuit 4, the column signal processing circuit 5, the horizontal driving circuit 6, and the like.

The vertical driving circuit 4 is, for example, configured by a shift register, selects a pixel driving wiring, supplies a pulse for driving pixels to the selected pixel driving wiring, and drives the pixels in units of rows. That is, the vertical driving circuit 4 selectively scans each pixel 2 of the pixel region 3 sequentially in units of rows in the vertical direction, and supplies, through a vertical driving line 9, a pixel signal based on a signal charge generated according to a light-receiving amount of, for example, a photodiode that is the photoelectric conversion unit of each pixel 2 to the column signal processing circuit 5.

The column signal processing circuit 5 is arranged, for example, by units of rows of the pixels 2, and performs signal processing such as noise removal on signals output from the pixels 2 equivalent to one line for each pixel row. That is, the column signal processing circuit 5 performs signal processing such as a CDS for removing fixed pattern noise that is unique to the pixels 2, signal amplification, and AD conversion. A horizontal selection switch (not shown in the drawings) is connected and provided between an output stage of the column signal processing circuit 5 and a horizontal signal line 10.

The horizontal driving circuit 6 is configured by, for example, a shift register, and selects, by sequentially outputting a horizontal scanning pulse, each of the column signal processing circuits 5 in order, and causes a pixel signal to be output from each of the column signal processing circuits 5 to the horizontal signal line 10.

The output circuit 7 performs signal processing on a signal that is sequentially supplied from each of the column signal processing circuits 5 through the horizontal signal line 10, and outputs the signal. For example, there is a case when only buffering is performed, and there is a case when black level adjustment, row variation correction, various types of digital signal processing, and the like are performed. An input and output terminal 12 processes signals with external portions.

Figure 2A:
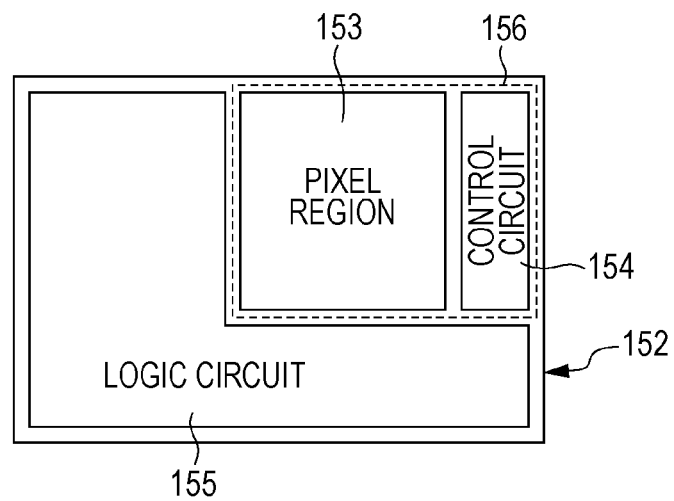
FIGS. 2A to 2C are schematic diagrams of a solid state imaging device according to an embodiment of the disclosure.

Next, the structure of a MOS type solid state imaging device according to the embodiment will be described. FIG. 2A is an outline configuration diagram that illustrates the structure of a MOS type solid state imaging device of the related art, and FIGS. 2B and 2C are outline configuration diagrams that illustrate the structure of the MOS type solid state imaging device according to the embodiment.

A MOS type solid state imaging device 151 of the related art is configured by equipping, as illustrated in FIG. 2A, within one semiconductor chip 152, a pixel region 153, a control circuit 154, and a logic circuit 155 for signal processing. Ordinarily, an image sensor 156 is configured by the pixel region 153 and the control circuit 154.

Figure 2B:
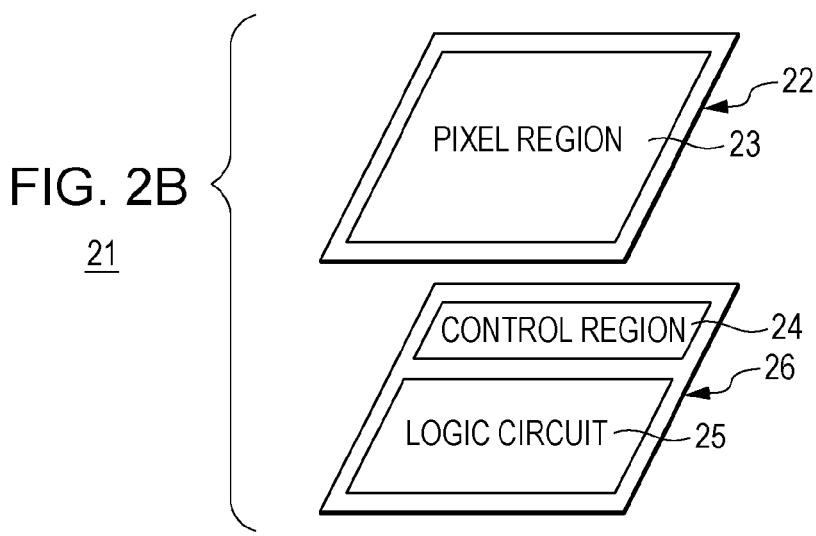

On the other hand, a MOS type solid state imaging device 21 of the embodiment example is equipped, as illustrated in FIG. 2B, with a pixel region 23 on a first semiconductor chip unit 22, and is equipped with a control circuit 24 and a logic circuit 25 including a signal processing circuit on a second semiconductor chip unit 26. The MOS type solid state imaging device 21 is configured as one semiconductor chip by mutually electrically connecting the first semiconductor chip unit 22 and the second semiconductor chip unit 26.

Figure 2C:
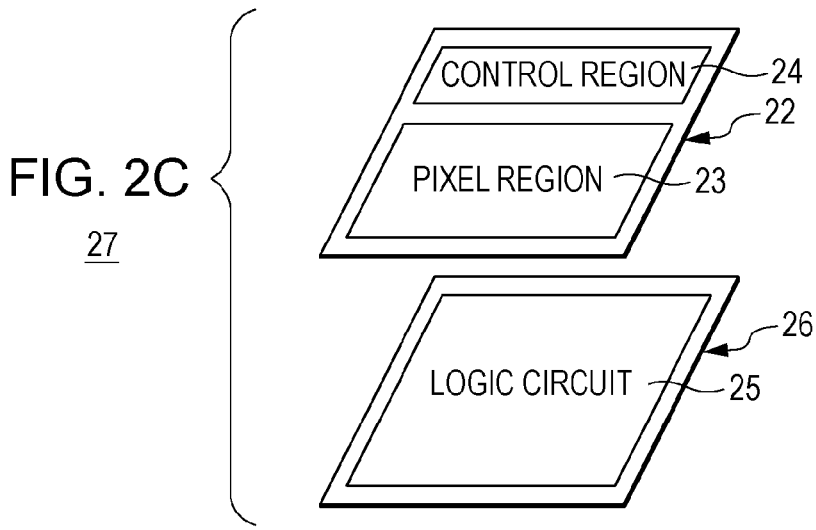

A MOS type solid state imaging device 27 according to another embodiment example of an embodiment of the disclosure is equipped, as illustrated in FIG. 2C, with the pixel region 23 and the control circuit 24 on the first semiconductor chip unit 22, and is equipped with the logic circuit 25 including a signal processing circuit on the second semiconductor chip unit 26. A MOS type solid state imaging device 27 is configured as one semiconductor chip by mutually electrically connecting the first semiconductor chip unit 22 and the second semiconductor chip unit 26.

Furthermore, although not shown in the drawings, a MOS type solid state imaging device according to still another embodiment example of an embodiment of the disclosure is equipped with the pixel region 23 and a control circuit unit that is suited to the control of a pixel region that is one portion of the control circuit on the first semiconductor chip unit 22. Further, the MOS type solid state imaging device is equipped with the logic circuit 25 and a control circuit unit that is suited to the control of the logic circuit that is another portion of the control circuit, on the second semiconductor chip unit 26. The MOS type solid state imaging device 27 is configured as one semiconductor chip by mutually electrically connecting the first semiconductor chip unit 22 and the second semiconductor chip unit 26.

The MOS type solid state imaging device according to the embodiment example described above has a structure in which different types of semiconductor chips are laminated, and has a feature described below.

2. First Embodiment (Configuration Example of Solid State Imaging Device)

Figure 3:
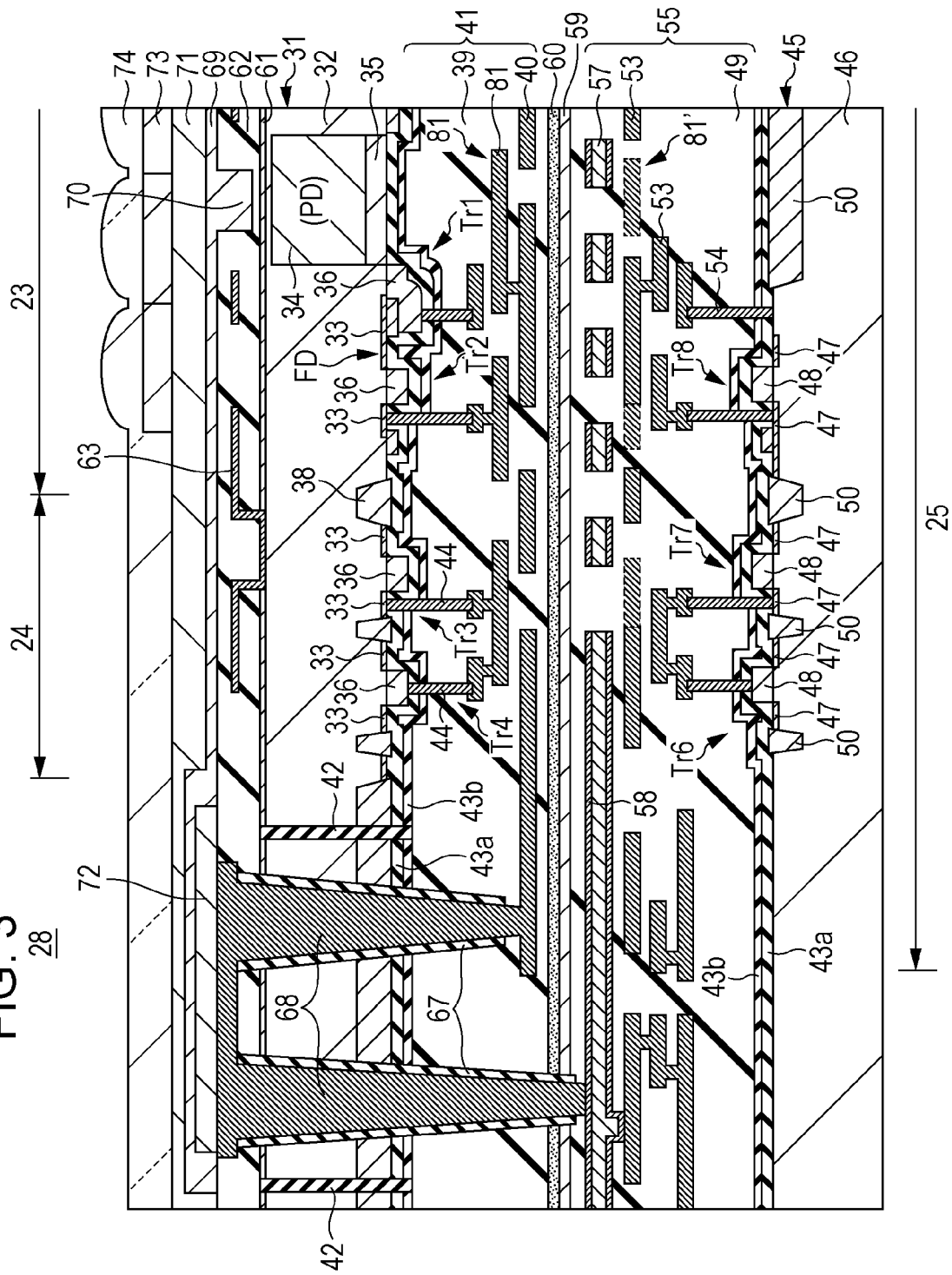
FIG. 3 is an outline configuration diagram that illustrates a first embodiment of a solid state imaging device according to an embodiment of the disclosure.

A solid state imaging device according to an embodiment of the disclosure, particularly a first embodiment of the MOS type solid state imaging device, is illustrated in FIG. 3. The MOS type solid state imaging device according to the embodiment is a backside-illumination type solid state imaging device. Although the MOS type solid state imaging device according to the embodiment applies the configuration of FIG. 2C, it is able to apply the configuration of another diagram 2B or a configuration in which the control circuit is equipped by being divided into each of the first and second semiconductor chip units. In a second embodiment and subsequent embodiments, similarly, the above configurations are able to be applied.

A solid state imaging device 28 according to the first embodiment is configured by a first semiconductor chip unit 31 and a second semiconductor chip unit 45 being affixed together. A pixel array (hereinafter, referred to as a pixel region) 23 that is a pixel composed of a photodiode PD that is a photoelectric conversion unit and a plurality of pixel transistors arranged two-dimensionally in plurality and a control circuit 24 are formed on the first semiconductor chip unit 31.

The photodiode PD is formed to include an n type semiconductor region 34 within a semiconductor well region 32 and a p type semiconductor region 35 on a substrate front surface side. A gate electrode 36 is formed on the substrate front surface that configures the pixels via a gate insulating film, and pixel transistors Tr1 and Tr2 are formed by a pair of the gate electrode 36 and a source and drain region 33. In FIG. 3, a plurality of pixel transistors is representatively illustrated by the two pixel transistors Tr1 and Tr2. The pixel transistor Tr1 that is adjacent to the photodiode PD is equivalent to a transfer transistor, and the source and drain region thereof is equivalent to a floating diffusion FD. Each unit pixel is separated by an element separation region 38.

On the other hand, the control circuit 24 is configured by a plurality of MOS transistors, each of which is formed in the semiconductor well region 32. In FIG. 3, MOS transistors Tr3 and Tr4 are representatively illustrated as the plurality of MOS transistors that configures the control circuit 24. Each MOS transistor Tr3 and Tr4 is formed by the n type source and drain region 33 and the gate electrode 36 that is formed via the gate insulating film.

A multilayer wiring layer 41 that is a wiring 40 of a plurality of layers arranged via an interlayer insulating film 39 is formed on a substrate front surface side. The wiring 40 is formed by, for example, a copper wiring. Pixel transistors and MOS transistors of the control circuit are connected to the appropriate wiring 40 via a connected conductor 44 that penetrates a first insulating film 43*a* and a second insulating film 43*b*. The first insulating film 43*a* is formed by, for example, a silicon oxide film, and the second insulating film 43*b* is formed by, for example, a silicon nitride film that is an etching stopper.

A reflection prevention film 61 is formed on the back surface of the semiconductor well region 32. A waveguide 70 by a waveguide material film (for example, a SiN film or the like) 69 is formed in a region that corresponds to each photodiode PD on the reflection prevention film 61. A light shielding film 63 that shields light to the appropriate regions is formed within an insulating film 62 made of, for example, a SiO film on a back surface of the semiconductor well region 32. Further, a color filter 73 and an on-chip micro-lens 74 are formed via a planarizing film 71 to correspond with each photodiode PD.

On the other hand, a logic circuit 25 including a signal processing circuit for signal processing is formed on the second semiconductor chip unit 45. The logic circuit 25 is configured to have a plurality of MOS transistors formed on, for example, a p type semiconductor well 46 to be separated by an element separation region 50. Here, the plurality of MOS transistors is represented by MOS transistors Tr6, Tr7, and Tr8. Each MOS transistor Tr6, Tr7, and Tr8 is formed to include a pair of n type source and drain region 47 and a gate electrode 48 formed via a gate insulating film.

A wiring 53 of a plurality of layers and a multilayer wiring layer 55 that is a wiring 57 including a barrier metal layer 58 arranged are formed on a semiconductor well region 46 via an interlayer insulating film 49. Each of the MOS transistors Tr6, Tr7, and Tr8 is connected to the appropriate wiring 53 via a connected conductor 54 that penetrates the first insulating film 43*a* and the second insulating film 43*b*.

The first semiconductor chip unit 31 and the second semiconductor chip unit 45 are affixed, for example, via an adhesive layer 60 so that the multilayer wiring layers 41 and 55 of each face the other. A stress compensation film 59 for reducing the stress of affixing is formed on an affixing face of the multiplayer wiring layer 55 on the second semiconductor chip unit 45 side. Otherwise, the affixing is also possible by plasma bonding.

Furthermore, the first semiconductor chip unit 31 and the second semiconductor chip unit 45 are electrically connected via a connected conductor 68. That is, connection holes that reach the appropriate wiring 40 of the multilayer wiring layer 41 by penetrating the semiconductor well region 32 of the first semiconductor chip unit 31 are formed. Further, connection holes that reach the appropriate wiring 53 of the multilayer wiring layer 55 of the second semiconductor chip unit 45 by penetrating the semiconductor well region 32 and the multilayer wiring layer 39 of the first semiconductor chip unit 31 are formed. The first and second semiconductor chip units 31 and 45 are electrically connected by embedding a connected conductor 68 that is mutually coupled with such connection holes. The surroundings of the connected conductor 68 are covered by an insulating film 67 for insulating from the semiconductor well region 32. The wirings 40 and 57 connected to the connected semiconductor 68 correspond to a vertical signal line. The connected conductor 68 is connected to an electrode pad (not shown in the drawings), or may be an electrode pad.

Formation of the connected conductor 68 is performed after affixing the first semiconductor chip unit 31 and the second semiconductor chip unit 45 and after thinning the semiconductor well region 32 of the first semiconductor chip unit 31. A cap film 72, a planarizing film 71, a color filter 73, and an on-chip micro-lens 74 are formed thereafter. An insulating spacer layer 42 is formed in a region that surrounds the connected conductor 68 in the semiconductor well region 32.

The solid state imaging device 28 of the embodiment has the pixel region 23 and the logic circuit 25 of the peripheral circuit unit arranged above and below in the substrate depth direction, and moreover has the photodiode PD and the MOS transistors Tr6 to Tr8 of the logic circuit 25 positioned in close proximity to each other.

There is a case when a protection diode is provided within the logic circuit 25 of the peripheral circuit unit.

In addition, in the embodiment, in particular, a light shielding member that shields light, emitted from an active element when the active element of the peripheral circuit unit is acting, from being incident on the photodiode PD of the pixels between the pixel region and the peripheral circuit unit is arranged. The active element is the MOS transistor, the protection diode, or the like. In the example, a light shielding member 81 is arranged between the pixel region 23 and the logic circuit 25 that configures the peripheral circuit unit.

Figure 4A:
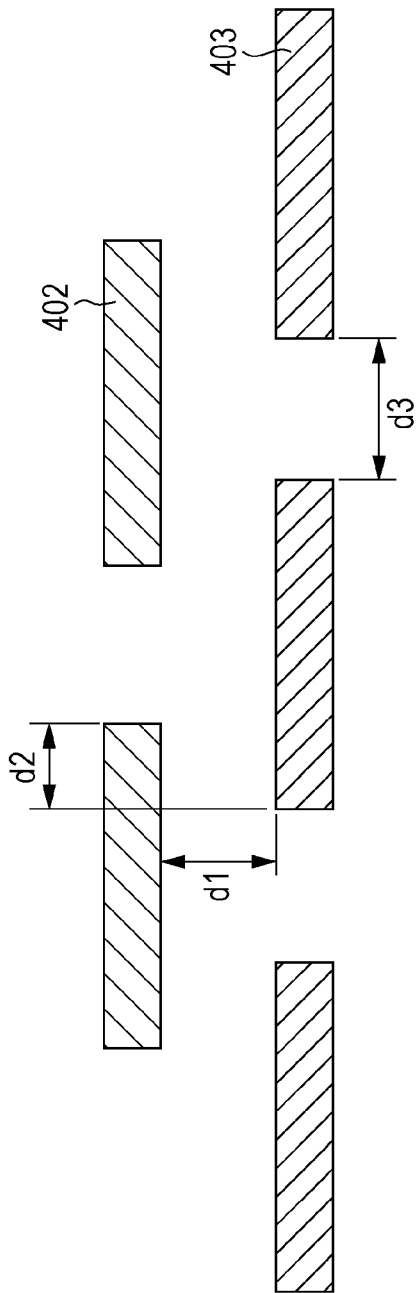
FIG. 4A is an outline cross-sectional diagram that illustrates an example of a light shielding member according to the first embodiment of the disclosure.
Figure 4B:
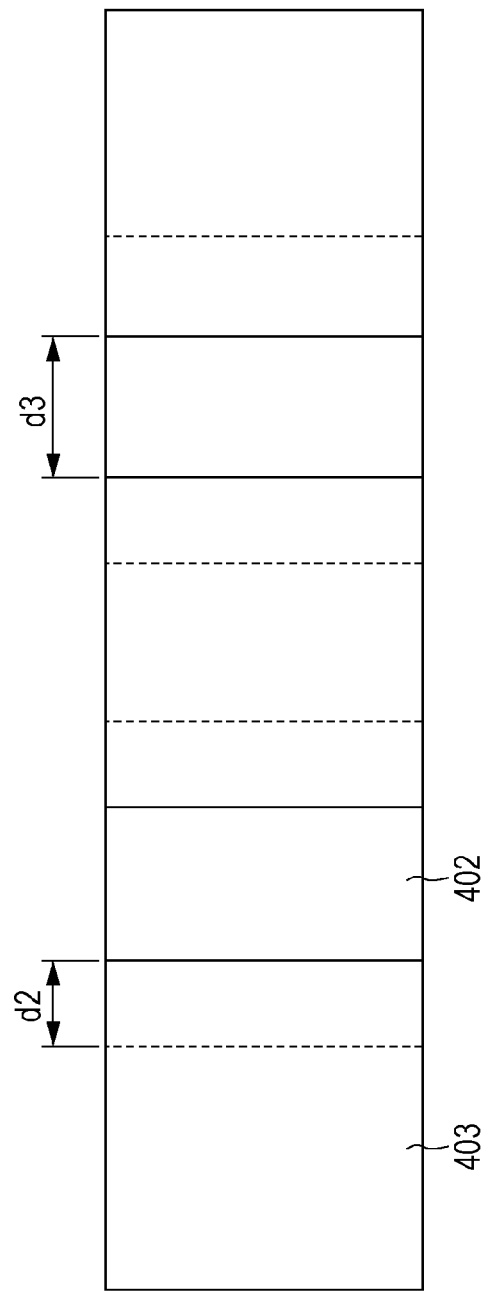
FIG. 4B is an outline plan view that illustrates an example of a light shielding member according to the first embodiment of the disclosure.

In the embodiment, the light shielding member 81 is formed on the appropriate wiring 40 of a plurality of layers of the multilayer wiring layer 41 of the first semiconductor chip unit 31. In the example shown in the drawings, when the wiring 40 has three layers, the light shielding member 81 is able to be formed on the wiring 40 of a second layer and a third layer that are close to the second semiconductor chip unit 45. In such a case, in order to cover the pixel region 23 without gaps, for example, as illustrated in FIGS. 4A and 4B, the light shielding member 81 is configured so that a wiring 402 of the second layer and a wiring 403 of the third layer partially overlap one another. Since the wiring 40 is formed of metal, the wirings 402 and 403 are also naturally formed of metal. Therefore, the light shielding member 81 that is configured using the wiring 40 becomes a reflection and dispersion member.

In FIGS. 4A and 4B, an overlapping amount d2 of the wirings 402 and 403 of the second layer and the third layer is determined by a distance d1 between the wirings and an opening width d3. For example, since hot carrier light is generated as a point light source, light that enters diagonally ought also to be shielded. Therefore, diagonal light components are shielded by maintaining the overlapping amount d2 to be at least larger than the distance d1 between the wirings.

Figure 5A:
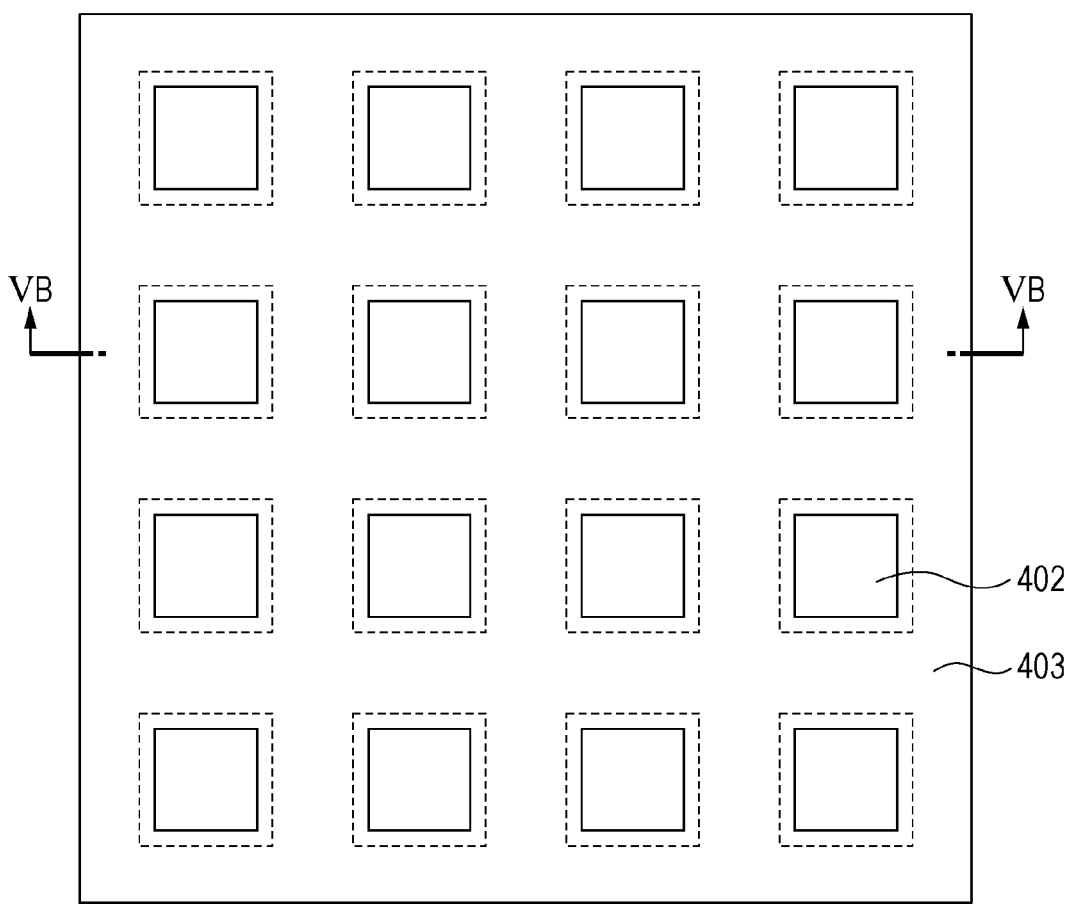
FIG. 5A is an outline plan view that illustrates another example of a light shielding member according to the first embodiment of the disclosure.
Figure 5B:
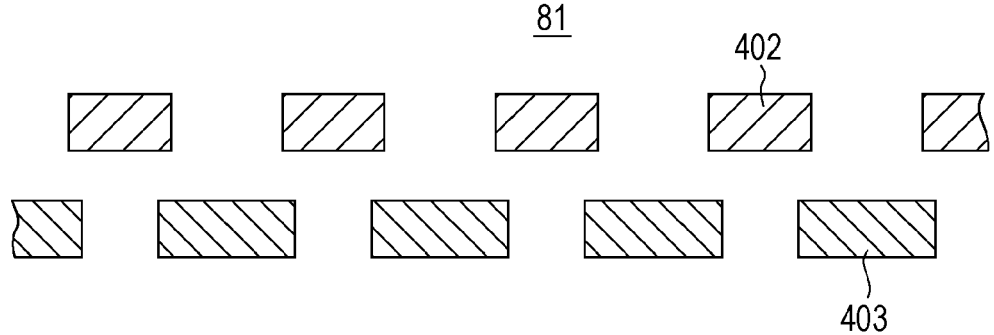
FIG. 5B is a cross-sectional diagram viewed along lines VB-VB of FIG. 5A.

Another example of the light shielding member 81 is also able to be configured, as illustrated in FIGS. 5A and 5B (cross-section over lines VB-VB in FIG. 5A), by forming the wiring 403 of the third layer in a lattice form, and forming the wiring 402 of the second layer so as to plug each lattice square and to partially overlap the wiring 403.

Figure 6:
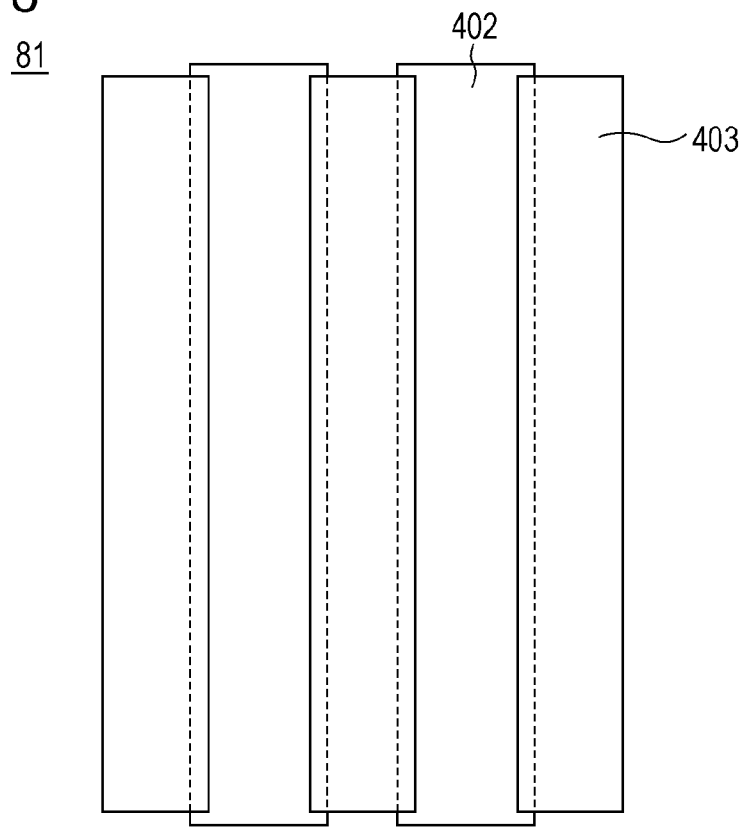
FIG. 6 is an outline diagram that illustrates another example of a light shielding member of the first embodiment.

Another example of the light shielding member 81 is able to be configured, as illustrated in FIG. 6, by arranging the wiring 403 of the third layer that extends in one direction and the wiring 402 of the second layer that similarly extends in one direction so that a portion of each is overlapped.

Figure 7:
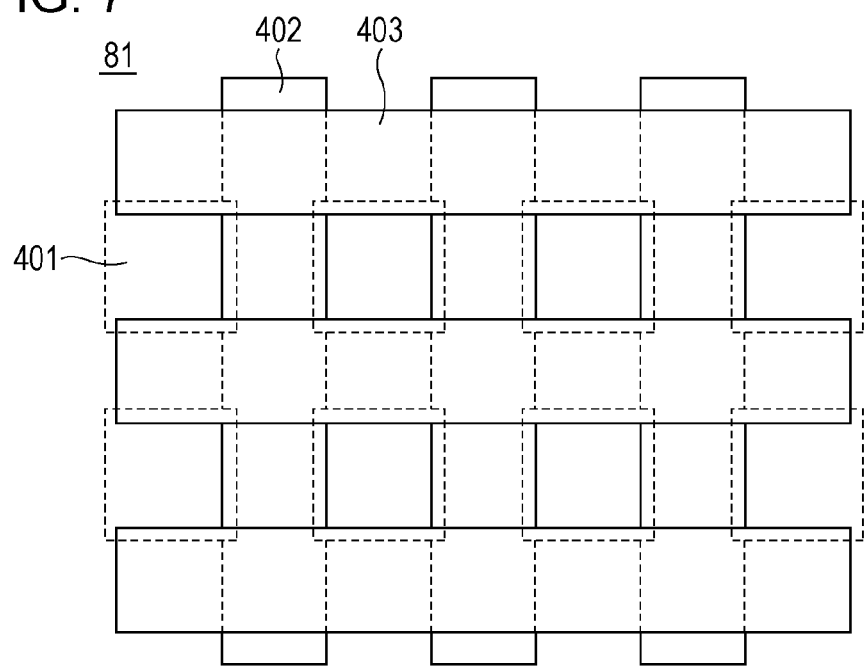
FIG. 7 is an outline diagram that illustrates another example of a light shielding member of the first embodiment.

Still another example of the light shielding member 81 is able to be configured as illustrated in FIG. 7. That is, the light shielding member 81 is able to be configured by arranging the wiring 403 of the third layer that extends in one direction, the wiring 402 of the second layer that extends in another direction to be orthogonal to the wiring 403, and a wiring 401 of a first layer that plugs each opening on which the wirings 402 and 403 of the second and third layers are not overlapped.

Embodiments of the light shielding member are not limited to the example described above, and various other embodiments are able to be adopted. The light shielding member 81 that reflects and disperses light using the wiring 40 of a plurality of layers is able to be configured by a combination of the wirings, a combination of the wirings and dummy wirings that are not used as wirings, and a combination of dummy wirings.

The light shielding member 81 using the above described wiring is configured using the wiring 40 of the multilayer wiring layer of the first semiconductor chip unit 31. Otherwise, as shown by the broken line in FIG. 3, a light shielding member 81' is able to be configured by arranging the wiring 53 of the multilayer wiring layer 55 of the second semiconductor chip unit 45 as described above and reflecting and dispersing light. The light shielding member is able to be configured by the light shielding member 81 that is formed on the first semiconductor chip unit 31 side, the light shielding member 81' that is formed on the second semiconductor chip unit 45 side, or a combination of the light shielding member 81 and the light shielding member 81'.

According to the solid state imaging device 28 according to the first embodiment, the light shielding member 81 is arranged between the photodiodes PD of the pixel region 23 and the logic circuit 25 that is positioned in close proximity below the photodiodes PD when seen from the light incidence side. That is, the light shielding member 81 that reflects and disperses light is arranged. The hot carrier light that is emitted from the MOS transistors of the logic circuit 25 is shielded by the light shielding member 81, and is not incident on the photodiodes PD. In particular, when the light shielding member 81 is formed so that a portion of the wirings is overlapped, the influence of the diffraction of light is able to be prevented by the light shielding member 81, and the incidence of hot carrier light from below to the photodiodes PD is able to be suppressed. When the light shielding member 81' or a combination of the light shielding members 81 and 81' is used, it is also similarly possible to suppress the incidence of hot carrier light to the photodiodes PD. Therefore, the hot carrier light being projected on the pixel region is avoided, and a solid state imaging device in which the image quality is thus improved is able to be provided.

Light that is emitted when the protection diode is acting is also able to be suppressed from being incident on the photodiodes PD.

With the light shielding member 81 using wirings, an attenuation function of the electromagnetic field that is generated at the second semiconductor chip unit 45 is obtained.

The pixel region 23 and the control circuit 24 are formed on the first semiconductor chip unit 31 and the logic circuit 25 that processes signals is formed on the second semiconductor chip unit 45 in the solid state imaging device 28 of the embodiment. In so doing, since it is a configuration in which the function of the pixel region and the logic function are formed and joined on different semiconductor chip units, the most appropriate process forming techniques are able to be used respectively for the pixel region 23 and the logic circuit 25. Therefore, a high-performance solid state imaging device in which the functions of each of the pixel region and the logic circuit are able to be adequately demonstrated is able to be provided.

3. Second Embodiment
(Configuration Example of Solid State Imaging Device)

Figure 8:
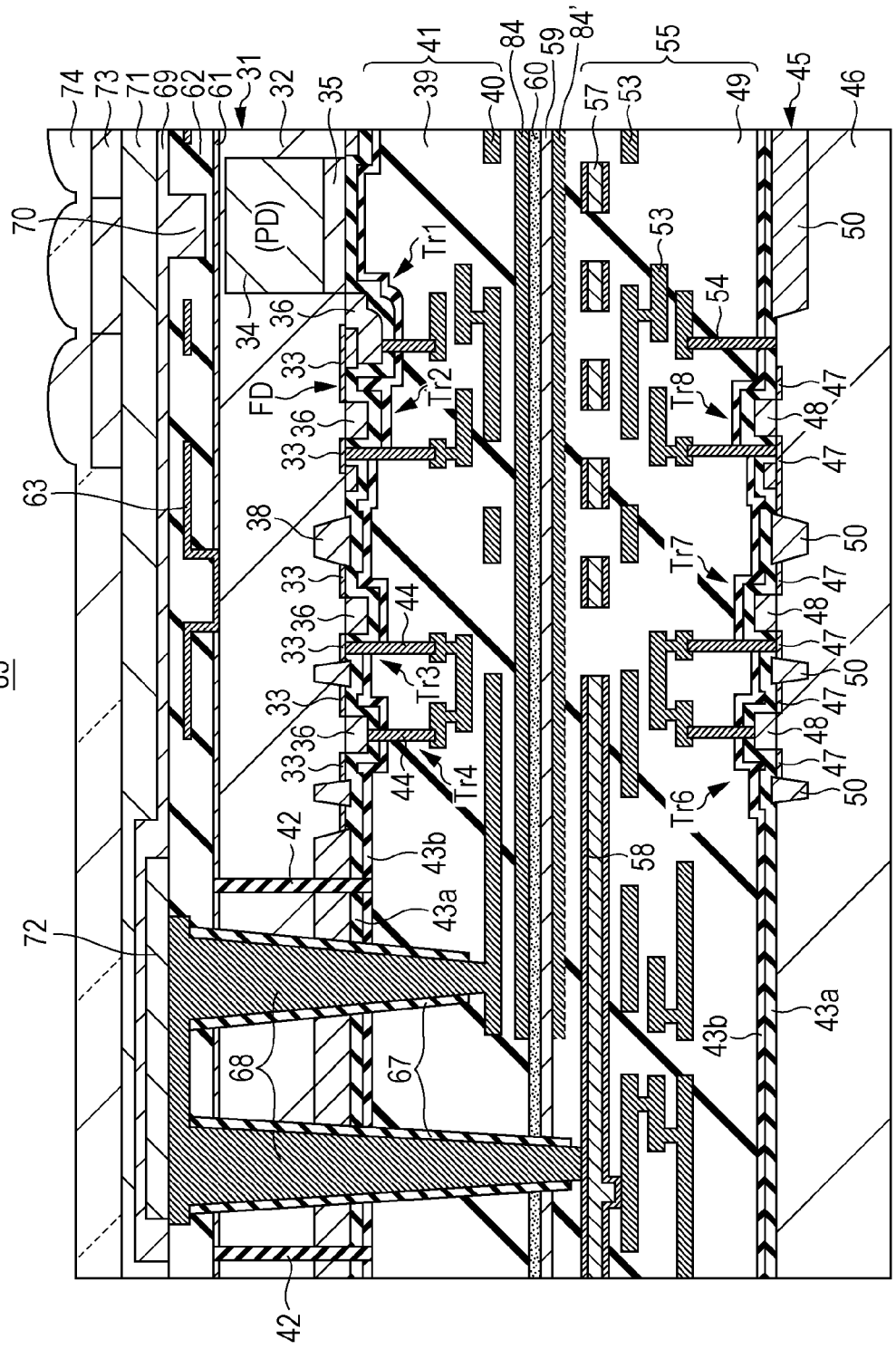
FIG. 8 is an outline configuration diagram that illustrates a second embodiment of a solid state imaging device according to an embodiment of the disclosure.

A solid state imaging device according to an embodiment of the disclosure, particularly a second embodiment of the MOS type solid state imaging device, is illustrated in FIG. 8. The MOS type solid state imaging device of the embodiment is a backside-illumination type solid state imaging device. In a solid state imaging device 83 of the second embodiment, similarly to above, a light shielding member that shields light, emitted from an active element when the active element of the peripheral circuit unit is acting, from being incident on the photodiodes PD of the pixels between the pixel region and the peripheral circuit unit is arranged. The active element is the MOS transistor, the protection diode, or the like.

In the embodiment, light shielding member 84 of a single metallic film which covers the pixel region 23 without gaps is arranged between the pixel region 23 and the logic circuit 25 that configures the peripheral circuit unit. In the present example, the light shielding member 84 is arranged in the vicinity of a joining face of the first semiconductor chip unit 31 and the second semiconductor chip unit 45, that is, above the multilayer wiring layer 41 on a first semiconductor chip unit 31. As a metallic material that configures the light shielding member 84, tungsten (W), copper (Cu), titanium (Ti), titanium nitride (TiN), carbon (C), or the like is able to be used. For example, in a case when tungsten (W) or titanium (Ti) is used, a light shielding characteristic of approximately two digits is able to be obtained by a film thickness of approximately 100 nm.

Here, the light shielding member 84 may be arranged anywhere as long as it is between the pixel region 23 and the MOS transistors of the logic circuit 25.

The light shielding member 84 described above is arranged in the vicinity of a joining face on the first semiconductor chip unit 32 side. Otherwise, as shown by the broken line in FIG. 8, a light shielding member 84' of a single metallic film is also able to be arranged in the vicinity of a joining face of the second semiconductor chip unit 45 side. Further, a total light shielding member is also able to be configured by a combination of the light shielding members 84 and 84'. The light shielding members 84 and 84' by a single metallic film become reflection and dispersion members.

The light shielding member 84 and 84' may be connected a light source, or may be connected to a ground. Alternatively, the light shielding members 84 and 84' may be electrically floating.

In FIG. 8, since other configurations are the same as those described in the first embodiment, the portions that correspond to FIG. 3 are given the same symbols and the detailed description thereof is omitted.

According to the solid state imaging device 83 according to the second embodiment, a light shielding member 84 of a single metallic film is arranged between the pixel region 23 and the logic circuit 25, for example, in the vicinity of a joining face of the first and second semiconductor chip units 31 and 45. Hot carrier light that is emitted from the MOS transistors of the logic circuit 25 is shielded by the light shielding member 84, and is not incident on the photodiodes PD. When the light shielding member 84' or a combination of the light shielding members 84 and 84' is used, it is also similarly possible to suppress the incidence of hot carrier light on the photodiodes PD. Therefore, the hot carrier light being projected on the pixel region is avoided, and a solid state imaging device in which the image quality is thus improved is able to be provided.

Light that is emitted when the protection diode is acting is also able to be suppressed from being incident on the photodiodes PD.

With the light shielding member 84 of a single metallic film, a function as a head spreader that diffuses the head generated from the second semiconductor chip unit 45 side that includes a logic circuit and an attenuation function of the electromagnetic field that is generated at the second semiconductor chip unit 45 are obtained. The light shielding members 84 and 84' are, when connected to a power source, able to be used as a power source stabilization capacity.

The pixel region 23 and the control circuit 24 are formed on the first semiconductor chip unit 31 and the logic circuit 25 that processes signals is formed on the second semiconductor chip unit 45 in the solid state imaging device 83 of the embodiment. Similarly to above, since it is a configuration in which the function of the pixel region and the logic function are formed and joined on different semiconductor chip units, the most appropriate process forming techniques are respectively able to be used for the pixel region 23 and the logic circuit 25. Therefore, a high-performance solid state imaging device in which the functions of each of the pixel region and the logic circuit are able to be adequately demonstrated is able to be provided.

(Modification Example)

In the second embodiment, the light shielding member 84 that is a single metallic film and composed of a reflection and dispersal member is formed. At this time, although it is desirable that the interval between the metallic light shielding member 84 and the connected conductor 68 is as narrow as possible in order that light does not easily pass through, if the interval is narrowed, a parasitic capacitance C (refer to FIG. 14) becomes large, which is not preferable.

Figure 14:
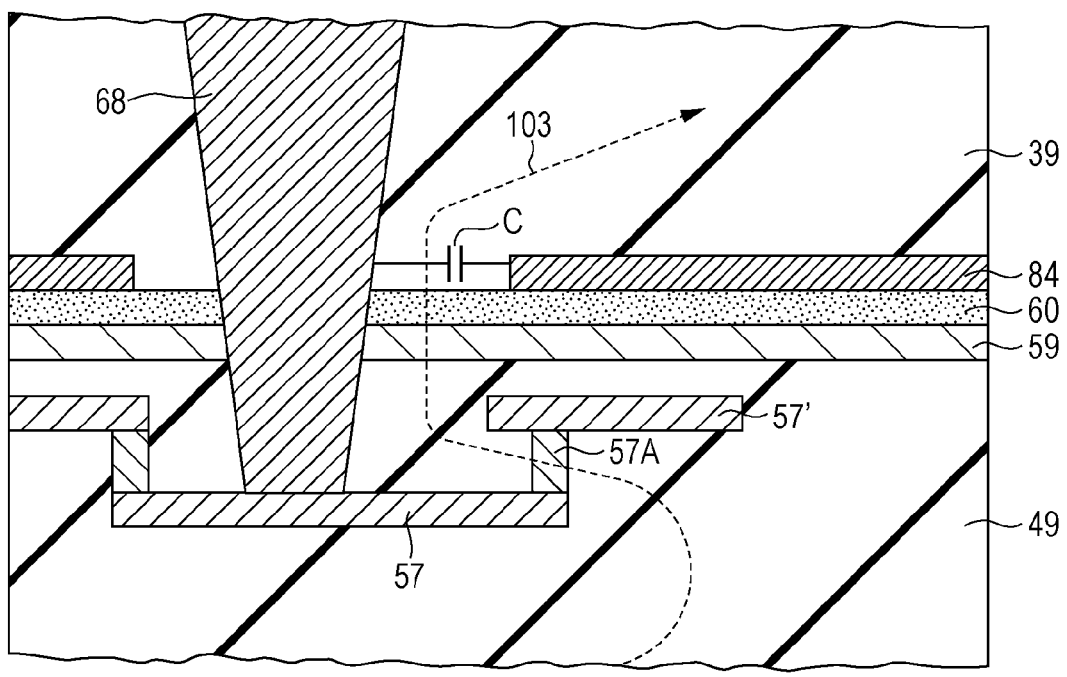
FIG. 14 is an outline configuration diagram of the main portions which illustrates a modification example according to the second embodiment.

In the modification example, as illustrated in FIG. 14, the light shielding member 84 that is a single metallic film is formed to be separated from the connected conductor 68 to an extent to which the parasitic capacitance does not exert an influence. On the other hand, a dummy wiring 57' of another layer is formed so as to partially overlap a wiring 57 on an upper layer of the wiring 57 that is connected to the connected conductor 68 and at the same to surround the connected conductor 68, and a cylindrical wall member (a so-called via) 57A for sealing is formed between the dummy wiring 57' and the wiring 57. By such a configuration, even if the interval between the connected conductor 68 and the light shielding member 84 is widened, light 103 from the logic circuit side is shielded by the cylindrical wall member 57A, and incidence of light to the photodiodes PD is suppressed.

4. Third Embodiment (Configuration Example of Solid State Imaging Device)

Figure 9:
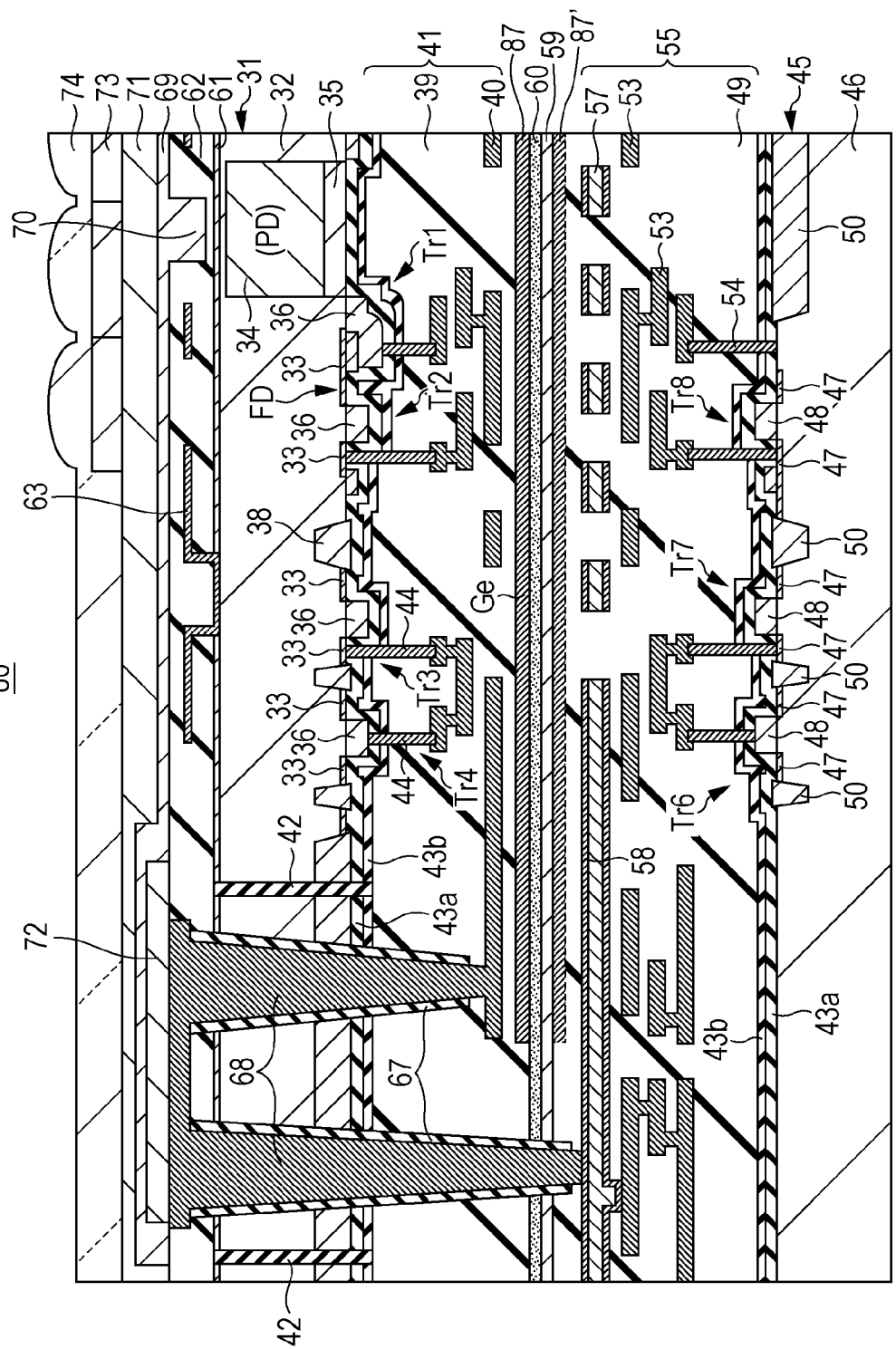
FIG. 9 is an outline configuration diagram that illustrates a third embodiment of a solid state imaging device according to an embodiment of the disclosure.

A solid state imaging device according to an embodiment of the disclosure, particularly a third embodiment of the MOS type solid state imaging device, is illustrated in FIG. 9. The MOS type solid state imaging device of the embodiment is a backside-illumination type solid state imaging device. In a solid state imaging device 86 of the third embodiment, similarly to above, a light shielding member that shields light, emitted from an active element when the active element of the peripheral circuit unit is acting, from being incident on the photodiodes PD of the pixels between the pixel region and the peripheral circuit unit is arranged. The active element is the MOS transistor, the protection diode, or the like.

In the embodiment, a light shielding member 87 of a light absorbing member that absorbs light is arranged between the pixel region 23 and the logic circuit 25 that configures the peripheral circuit unit, so as to cover the pixel region 23 without gaps. In the present example, the light shielding member 87 is arranged in the vicinity of a joining face of the first semiconductor chip unit 31 and the second semiconductor chip unit 45, that is, above the multilayer wiring layer 41 on a first semiconductor chip unit 31. The light shielding member 87 has a function of absorbing hot carrier light from the MOS transistors of the logic circuit and preventing the light from being incident on the photodiodes PD. The light shielding member 87 has a color mixing prevention function of preventing light exposed from a back surface from not being completely absorbed by the pixels and permeating, reflecting by the wiring of the second semiconductor chip unit 45, and causing color mixing by being incident on the photodiodes PD of other pixels.

As a light absorbing member that configures the light shielding member 87, a single film of a semiconductor with a narrower band gap than germanium (Ge) or silicon of a synthetic type (for example, chalcopyrite CuInSe2) or the like is able to be used. Silicon is used as the substrate in the first and second semiconductor chip units 31 and 45. A semiconductor film that has a narrower band gap than silicon has a high absorption rate of a near-infrared region, and in the case of germanium (Ge), for example, the absorption rate is approximately ten times the level of silicon (Si). That is, approximately two digits of photons are absorbable with a film thickness of approximately one tenth. For such a reason, light of the near-infrared region is able to be absorbed by a Ge film of a film thickness of 1 μm to several μm.

A reflection prevention film that is each of a plurality of dielectric films, with different dielectric constants, that are laminated is able to be used as the light absorbing member that configures the light shielding member 87. A silicon oxide film, a silicon nitride film, or the like, for example, is able to be used as the dielectric films with different dielectric constants.

The light shielding member 87 described above is arranged in the vicinity of a joining face on the first semiconductor chip unit 32 side. Otherwise, as shown by the broken line in FIG. 9, a light shielding member 87' of a light absorbing member is also able to be arranged in the vicinity of a joining face of the second semiconductor chip unit 45 side. Further, a total light shielding member is also able to be configured by a combination of the light shielding members 87 and 87'. The light shielding members 87 and 87' are light absorbing members.

In FIG. 9, since other configurations are the same as those described in the first embodiment, the portions that correspond to FIG. 3 are given the same symbols and the detailed description thereof is omitted.

According to the solid state imaging device 86 according to the third embodiment, a light shielding member 87 of a light absorbing member is arranged between the pixel region 23 and the logic circuit 25, for example, in the vicinity of a joining face of the first and second semiconductor chip units 31 and 45. Hot carrier light that is emitted from the MOS transistors of the logic circuit 25 is absorbed by the light shielding member 87, and is not incident on the photodiodes PD. When the light shielding member 87' or a combination of the light shielding members 87 and 87' is used, it is also similarly possible to suppress the incidence of hot carrier light on the photodiodes PD. Further, light that is emitted when the protection diode that has been arranged on the logic circuit side is acting is also able to be suppressed from being incident on the photodiodes PD. Therefore, the hot carrier light being projected on the pixel region is avoided, and a solid state imaging device in which the image quality is thus improved is able to be provided.

On the other hand, although light that is exposed on a back surface is incident on the pixels, even if there is a concern that long-wavelength components that are not completely absorbed by the pixels and are permeated are reflected on the wiring of the second semiconductor chip unit 45 or the like and are incident once again on the other pixels, long-wavelength components that are permeated are absorbed by the light shielding members 87 and 87' of a light absorbing member. In such a manner, the occurrence of color mixing is able to be suppressed.

The pixel region 23 and the control circuit 24 are formed on the first semiconductor chip unit 31 and the logic circuit that processes signals is formed on the second semiconductor chip unit 45 in the solid state imaging device 86 of the embodiment. Similarly to above, since it is a configuration in which the function of the pixel region and the logic function are formed and joined on different semiconductor chip units, the most appropriate process forming techniques are respectively able to be used for the pixel region 23 and the logic circuit 25. Therefore, a high-performance solid state imaging device in which the functions of each of the pixel region and the logic circuit are able to be adequately demonstrated is able to be provided.

5. Fourth Embodiment
(Configuration Example of Solid State Imaging Device)

Figure 10:
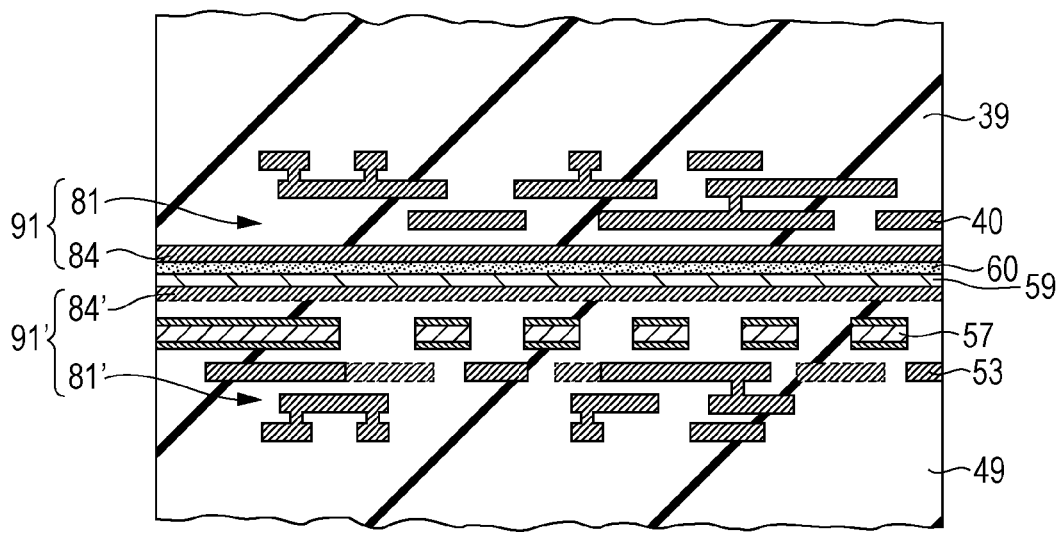
FIG. 10 is an outline configuration diagram of the main portions which illustrates a fourth embodiment of a solid state imaging device according to an embodiment of the disclosure.

A solid state imaging device according to an embodiment of the disclosure, particularly a fourth embodiment of the MOS type solid state imaging device, is illustrated in FIG. 10. The MOS type solid state imaging device of the embodiment is a backside-illumination type solid state imaging device. FIG. 10 illustrates only the configuration of the main portions in which only the region of the light shielding member is illustrated, and since other configurations are the same those of the first embodiment, the details thereof are omitted.

In a solid state imaging device 89 according to the fourth embodiment, similarly to above, a light shielding member that shields light, emitted from an active element when the active element of the peripheral circuit unit is acting, from being incident on the photodiodes PD of the pixels between the pixel region and the peripheral circuit unit is arranged. The active element is the MOS transistor, the protection diode, or the like.

In the embodiment, light shielding members 91 and 91' are configured by a combination of the light shielding members 81 and 81' using the wiring of the multilayer wiring layer of the first embodiment, and the light shielding members 84 and 84' of a single metallic film of the second embodiment. The light shielding member of the present embodiment is configured by the light shielding member 91, the light shielding member 91', or a combination of the light shielding members 91 and 91'.

Since other configurations are the same as those described in the first embodiment, the corresponding portions are given the same symbols and the detailed description thereof is omitted.

According to the solid state imaging device 89 according to the fourth embodiment, a light shielding member 91 that is a combination of the light shielding member 81 that uses the wiring and the light shielding member 84 of a single metallic film is arranged between the pixel region 23 and the logic circuit 25. In so doing, hot carrier light that is emitted from the MOS transistors of the logic circuit 25 is more reliably able to be suppressed from being incident on the photodiodes PD. The same effects are also accomplished in a case when the light shielding member 91' or a combination of the light shielding members 91 and 91' is used. Further, light that is emitted when the protection diode that has been arranged on the logic circuit side is acting is also able to be suppressed from being incident on the photodiodes PD. Therefore, the hot carrier light being projected on the pixel region is avoided, and a solid state imaging device in which the image quality is thus improved is able to be provided.

In the solid state imaging device 89 of the embodiment, similarly to above, the pixel region 23 and the control circuit 24 are formed on the first semiconductor chip unit 31 and the logic circuit 25 that processes signals is formed on the second semiconductor chip unit 45. Similarly to above, since it is a configuration in which the function of the pixel region and the logic function are formed and joined on different semiconductor chip units, the most appropriate process forming techniques are respectively able to be used for the pixel region 23 and the logic circuit 25. Therefore, a high-performance solid state imaging device in which the functions of each of the pixel region and the logic circuit are able to be adequately demonstrated is able to be provided.

6. Fifth Embodiment
(Configuration Example of Solid State Imaging Device)

Figure 11:
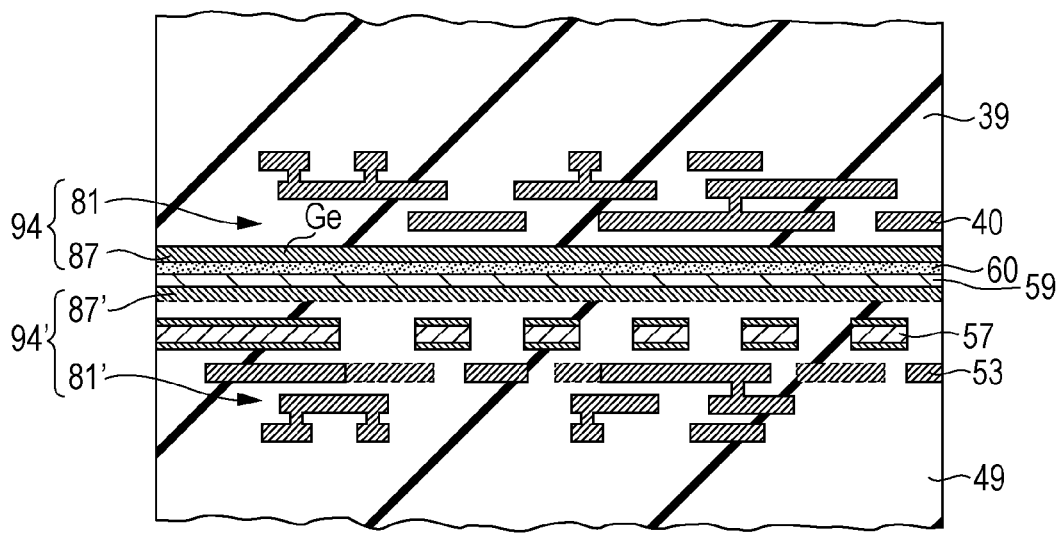
FIG. 11 is an outline configuration diagram of the main portions which illustrates a fifth embodiment of a solid state imaging device according to an embodiment of the disclosure.

A solid state imaging device according to an embodiment of the disclosure, particularly a fifth embodiment of the MOS type solid state imaging device, is illustrated in FIG. 11. The MOS type solid state imaging device of the embodiment is a backside-illumination type solid state imaging device. FIG. 11 illustrates only the configuration of the main portions in which only the region of the light shielding member is illustrated, and since other configurations are the same those of the first embodiment, the details thereof are omitted.

In a solid state imaging device 93 according to the fifth embodiment, similarly to above, a light shielding member that shields light, emitted from an active element when the active element of the peripheral circuit unit is acting, from being incident on the photodiodes PD of the pixels between the pixel region and the peripheral circuit unit is arranged. The active element is the MOS transistor, the protection diode, or the like.

In the embodiment, light shielding members 94 and 94' are configured by a combination of the light shielding members 81 and 81' using the wiring of the multilayer wiring layer of the first embodiment, and the light shielding members 87 and 87' of a light absorbing member of the third embodiment. The light shielding member of the present embodiment is configured by the light shielding member 94, the light shielding member 94', or a combination of the light shielding members 94 and 94'.

Since other configurations are the same as those described in the first embodiment, corresponding portions are given the same symbols and the detailed description thereof is omitted.

According to the solid state imaging device 93 according to the fifth embodiment, a light shielding member 94 that is a combination of the light shielding member 81 that uses the wiring and the light shielding member 87 of a light absorbing member is arranged between the pixel region 23 and the logic circuit 25. In so doing, hot carrier light that is emitted from the MOS transistors of the logic circuit 25 is more reliably able to be suppressed from being incident on the photodiodes PD. Further, by the presence of the light shielding member 87 of a light absorbing member, light that has permeated through the pixels are suppressed from reaching the wiring 53 of the second semiconductor chip unit 45, and color mixing caused by light reflected by the wiring 53 is able to be suppressed. The same effects are also accomplished in a case when the light shielding member 94' or a combination of the light shielding members 94 and 94' is used. Further, light that is emitted when the protection diode that has been arranged on the logic circuit side is acting is also able to be suppressed from being incident on the photodiodes PD. Therefore, the hot carrier light being projected on the pixel region is avoided, and a solid state imaging device in which the image quality is thus improved is able to be provided.

In the solid state imaging device 93 of the embodiment, similarly to above, the pixel region 23 and the control circuit 24 are formed on the first semiconductor chip unit 31 and the logic circuit 25 that processes signals is formed on the second semiconductor chip unit 45. Similarly to above, since it is a configuration in which the function of the pixel region and the logic function are formed and joined on different semiconductor chip units, the most appropriate process forming techniques are respectively able to be used for the pixel region 23 and the logic circuit 25.

Therefore, a high-performance solid state imaging device in which the functions of each of the pixel region and the logic circuit are able to be adequately demonstrated is able to be provided.

7. Sixth Embodiment
(Configuration Example of Solid State Imaging Device)

Figure 12:
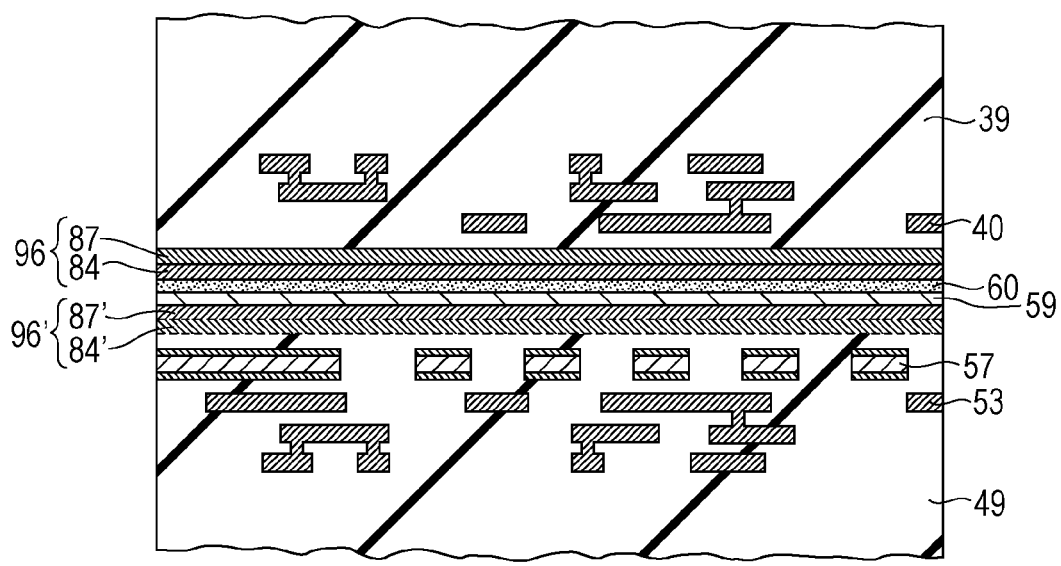
FIG. 12 is an outline configuration diagram of the main portions which illustrates a sixth embodiment of a solid state imaging device according to an embodiment of the disclosure.

A solid state imaging device according to an embodiment of the disclosure, particularly a sixth embodiment of the MOS type solid state imaging device, is illustrated in FIG. 12. The MOS type solid state imaging device of the embodiment is a backside-illumination type solid state imaging device. FIG. 12 illustrates only the configuration of the main portions in which only the region of the light shielding member is illustrated, and since other configurations are the same those of the first embodiment, the details thereof are omitted.

In a solid state imaging device 95 according to the sixth embodiment, similarly to above, a light shielding member that shields light, emitted from an active element when the active element of the peripheral circuit unit is acting, from being incident on the photodiodes PD of the pixels between the pixel region and the peripheral circuit unit is arranged. The active element is the MOS transistor, the protection diode, or the like.

In the embodiment, light shielding members 96 and 96' are configured by a combination of the light shielding members 84 and 84' of a single metallic film of the second embodiment, and the light shielding members 87 and 87' of a light absorbing member of the third embodiment. The light shielding member of the present embodiment is configured by the light shielding member 96, the light shielding member 96', or a combination of the light shielding members 96 and 96'. In the first semiconductor chip unit 31 side, the light shielding member 87 of a light absorbing member is arranged further to the photodiode PD side than the light shielding member 84 of a single metallic film.

Since other configurations are the same as those described in the first embodiment, corresponding portions are given the same symbols and the detailed description thereof is omitted.

According to the solid state imaging device 93 according to the sixth embodiment, a light shielding member 96 that is a combination of the light shielding member 84 of a single metallic film and the light shielding member 87 of a light absorbing member is arranged between the pixel region 23 and the logic circuit 25. In so doing, hot carrier light that is emitted from the MOS transistors of the logic circuit 25 is more reliably able to be suppressed from being incident on the photodiodes PD. Further, by the presence of the light shielding member 87 of a light absorbing member, light that has permeated through the pixels are suppressed from reaching the wiring 53 of the second semiconductor chip unit 45, and color mixing caused by light reflected by the wiring 53 is able to be suppressed. The same effects are also accomplished in a case when the light shielding member 96' or a combination of the light shielding members 96 and 96' is used. Further, light that is emitted when the protection diode that has been arranged on the logic circuit side is acting is also able to be suppressed from being incident on the photodiodes PD. Therefore, the hot carrier light being projected on the pixel region is avoided, and a solid state imaging device in which the image quality is thus improved is able to be provided.

Although since, for example, even when photons of a hot carrier are reflected, it is not a photon quantity that influences the actions of the logic circuit on the logic circuit 25 side, formation of the light absorbing member 87' is not a necessity, it may be formed in order to raise the light absorption characteristics.

In the solid state imaging device 95 of the embodiment, similarly to above, the pixel region 23 and the control circuit 24 are formed on the first semiconductor chip unit 31 and the logic circuit 25 that processes signals is formed on the second semiconductor chip unit 45. Similarly to above, since it is a configuration in which the function of the pixel region and the logic function are formed and joined on different semiconductor chip units, the most appropriate process forming techniques are respectively able to be used for the pixel region 23 and the logic circuit 25. Therefore, a high-performance solid state imaging device in which the functions of each of the pixel region and the logic circuit are able to be adequately demonstrated is able to be provided.

8. Seventh Embodiment
(Configuration Example of Solid State Imaging Device)

Figure 13:
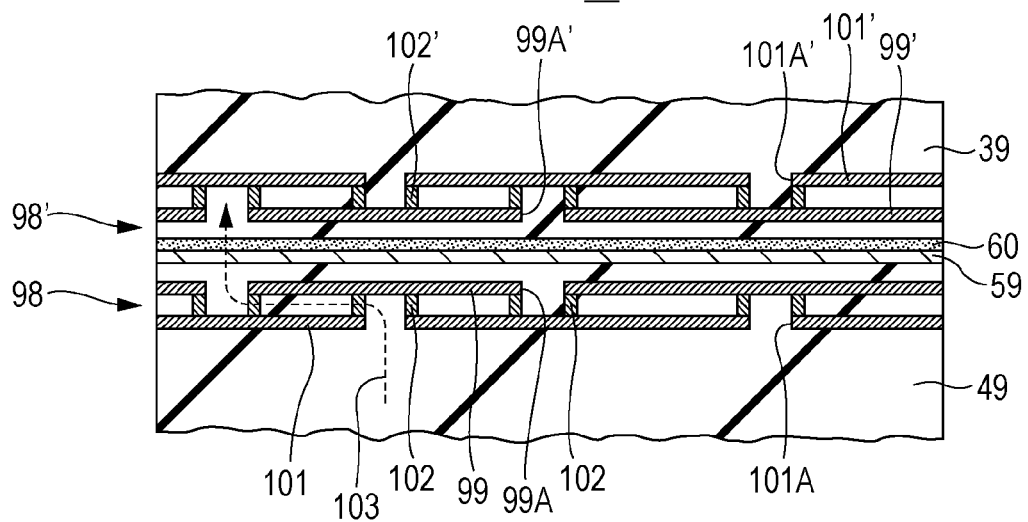
FIG. 13 is an outline configuration diagram of the main portions which illustrates a seventh embodiment of a solid state imaging device according to an embodiment of the disclosure.

A solid state imaging device according to an embodiment of the disclosure, particularly a seventh embodiment of the MOS type solid state imaging device, is illustrated in FIG. 13. The MOS type solid state imaging device of the embodiment is a backside-illumination type solid state imaging device. FIG. 13 illustrates only the configuration of the main portions in which only the region of the light shielding member is illustrated, and since other configurations are the same those of the first embodiment, the details thereof are omitted.

In a solid state imaging device 97 according to the seventh embodiment, similarly to above, a light shielding member that shields light, emitted from an active element when the active element of the peripheral circuit unit is acting, from being incident on the photodiodes PD of the pixels between the pixel region and the peripheral circuit unit is arranged. The active element is the MOS transistor, the protection diode, or the like.

In the second embodiment described above, the light shielding member 84 is formed by a single metallic film. If the number of steps is taken into consideration, a single film is desirable as the light shielding member. However, if hole defects of a metallic film or the planarization of an affixing surface of the first and second semiconductor chip units are taken into consideration, forming the light shielding member as a single layer film may be difficult.

A first light shielding member 99 and a second light shielding member 101 of two layers of a single metallic film are arranged in the vicinity of the first and second semiconductor chip units 31 and 45 in the present embodiment and on the second semiconductor chip unit 45 side in the present example. The respective light shielding member 99 and 101 are formed in patterns that have openings 99A and 101A in different positions. Further, a cylindrical wall member (a so-called via) 102 for sealing is formed between the first light shielding member 99 and the second light shielding member 101 so as to surround the circumference of the openings 99A and 101A.

In the present embodiment, as shown by the broken lines, a light shielding member 98' that is the same configuration may be arranged on the first semiconductor chip unit 45 side. A first light shielding member 99' and a second light shielding member 101' of two layers of a single metallic film are arranged in the light shielding member 98'. The respective light shielding members 99' and 101' are formed in patterns that have openings 99A' and 101A' in different positions. Further, a cylindrical wall member (a so-called via) 102' for sealing is formed between the first light shielding member 99' and the second light shielding member 101' so as to surround the circumference of the openings 99A' and 101A'.

The light shielding member of the embodiment is able to be configured by the light shielding member 98, the light shielding member 98', or a combination of the light shielding members 98 and 98'.

Since other configurations are the same as those described in the first embodiment, corresponding portions are given the same symbols and the detailed description thereof is omitted.

According to the solid state imaging device 97 according to the seventh embodiment, the light shielding member 98 is configured by the first and second light shielding members 99 and 101 of two layers of a single metallic film in which the opening positions are different, and a cylindrical wall member 102 that is connected to the first and second light shielding members that surround the vicinity of the openings and that are opposing. Although since even if there are hole defects in the first and second light shielding members 99 and 101, the light shielding member 98 has a two-layer structure and moreover the cylindrical wall member 102 is provided, light 103 from below the broken line shown in the drawings is reliably shielded, and incidence on the photodiodes PD is suppressed. The same effects are also accomplished in a case when the light shielding member 98' or a combination of the light shielding members 98 and 98' is used. Further, light that is emitted when the protection diode that has been arranged on the logic circuit side is acting is also able to be suppressed from being incident on the photodiodes PD. Therefore, the hot carrier light being projected on the pixel region is avoided, and a solid state imaging device in which the image quality is thus improved is able to be provided.

In the solid state imaging device 97 of the embodiment, similarly to above, the pixel region 23 and the control circuit 24 are formed on the first semiconductor chip unit 31 and the logic circuit 25 that processes signals is formed on the second semiconductor chip unit 45. Similarly to above, since it is a configuration in which the function of the pixel region and the logic function are formed and joined on different semiconductor chip units, the most appropriate process forming techniques are respectively able to be used for the pixel region 23 and the logic circuit 25. Therefore, a high-performance solid state imaging device in which the functions of each of the pixel region and the logic circuit are able to be adequately demonstrated is able to be provided.

9. Eighth Embodiment
(Configuration Example of Solid State Imaging Device)

Figure 15:
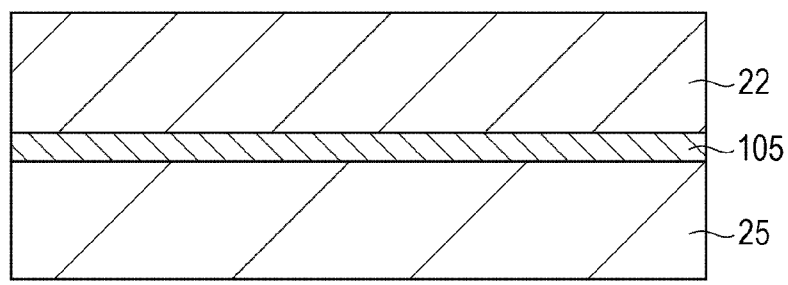
FIG. 15 is an outline configuration diagram that illustrates an eighth embodiment of a solid state imaging device according to an embodiment of the disclosure.

A solid state imaging device according to an embodiment of the disclosure, particularly an eighth embodiment of the MOS type solid state imaging device, is illustrated in FIG. 15. A solid state imaging device 104 according to the eighth embodiment is configured by joining, as described above, the first semiconductor chip unit 22 that includes the pixel region 23, the second semiconductor chip unit 26 that includes the logic circuit 25, and a third semiconductor chip unit 105 that functions as a light shielding member that absorbs light between the first and second semiconductor chip units 22 and 26. The third semiconductor chip unit 105 is formed by a semiconductor such as Ge, for example, with a narrow band gap, and is formed in a thin film form.

In the solid state imaging device 104, in a case when configured as a back surface exposure type, the first semiconductor chip unit 22 and the second semiconductor chip unit 26 are integrally joined with the multilayer wiring layer of each facing the other, while interposing the third semiconductor chip unit 105. In the solid state imaging device 104, in a case when configured as a front surface exposure type, the back surface of the first semiconductor chip unit 22 and the multilayer wiring layer of the second semiconductor chip unit 26 face each other and are integrally joined, while interposing the third semiconductor chip unit 105.

According to the solid state imaging device 104 according to the eighth embodiment, the first semiconductor chip unit 22 that at least includes the pixel region and the second semiconductor chip unit 26 that at least includes the logic circuit that configures the peripheral circuits are joined via the third semiconductor chip unit 105 that absorbs light. By such a configuration, even if hot carrier light is emitted from the second semiconductor chip unit 26 side, the hot carrier light is shielded by the third semiconductor chip unit 105 and is not incident on the photodiodes PD of the first semiconductor chip unit 22.

Therefore, the hot carrier light being projected on the pixel region is avoided, and a solid state imaging device in which the image quality is thus improved is able to be provided. With regard to light emitted when the protection diode is acting is also suppressed from being incident on the photodiodes PD.

10. Ninth Embodiment (Configuration Example of Solid State Imaging Device)

Figure 16:
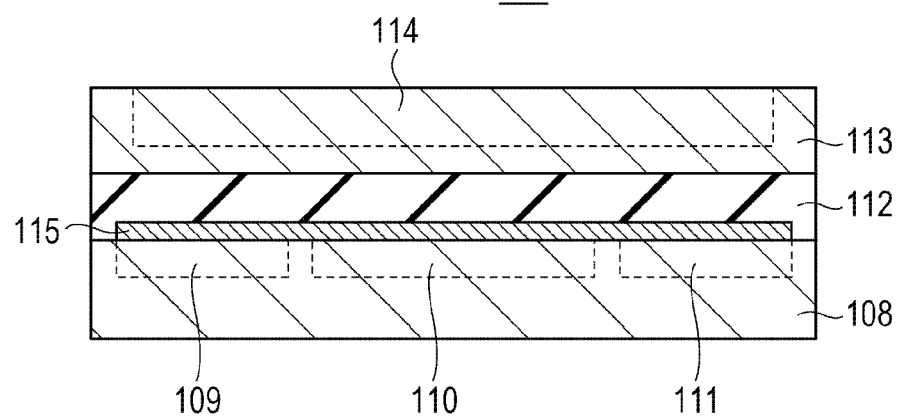
FIG. 16 is an outline configuration diagram that illustrates a ninth embodiment of a solid state imaging device according to an embodiment of the disclosure.

A solid state imaging device according to an embodiment of the disclosure, particularly a ninth embodiment of the MOS type solid state imaging device, is illustrated in FIG. 16. The MOS type solid state imaging device of the embodiment is a back surface exposure type solid state imaging device. The first embodiment has a configuration in which the logic circuit that configures the pixel region and the peripheral circuits is arranged above and below in the depth direction of the substrate by joining the first semiconductor chip unit 31 and the second semiconductor chip unit 45. In the ninth embodiment, another embodiment of a configuration in which the pixel region and the peripheral circuits are arranged above and below, that is, three-dimensionally, is shown.

A solid state imaging device 107 according to the ninth embodiment is has a control circuit 109 that configures the peripheral circuits, a logic circuit 110 for signal processing, and a pixel transistor group 111 formed on a silicon semiconductor substrate 108. A multilayer wiring layer 112 in which a wiring of a plurality of layers is arranged via an interlayer insulating film is formed on the semiconductor substrate 108. Further, a silicon epitaxial layer 113 is formed on the multilayer wiring layer 112, and the solid state imaging device 107 is configured by forming a pixel region 114 in which only the photodiodes PD that become a plurality of photoelectric conversion units are two-dimensionally arranged in a line on the epitaxial layer 113. The pixels are configured by the photodiodes within the epitaxial layer and the plurality of pixel transistors within the semiconductor substrate 108.

In addition, in the embodiment, a light shielding member 115 that is configured by any of the light shielding members described above is arranged between the pixel region 114 and the logic circuit 110 that configures at least the peripheral circuit unit. The light shielding member 115 is formed on the multilayer wiring layer 112.

According to the solid state imaging device 107 according to the ninth embodiment, the light shielding member 115 is arranged between the pixel region 114 and the peripheral circuits with a configuration in which the pixel region 114, the logic circuit 110 that configures the peripheral circuit unit, and the control circuit 109 are arranged above and below within the substrate. By such a configuration, even if hot carrier light is emitted from the peripheral circuit unit, the hot carrier light is shielded by the light shielding member 115 and is not incident on the photodiodes PD of the pixel region 114 above. Therefore, the hot carrier light being projected on the pixel region is avoided, and a solid state imaging device in which the image quality is thus improved is able to be provided. With regard to light emitted when the protection diode is acting is also suppressed from being incident on the photodiodes PD.

11. Tenth Embodiment (Configuration Example of Solid State Imaging Device)

A solid state imaging device according to an embodiment of the disclosure, in particular a MOS type solid state imaging device of a tenth embodiment will be described. The MOs type solid state imaging device according to the present embodiment is a front surface exposure type solid state imaging device. Although the solid state imaging device according to the tenth embodiment is not shown in the drawings, it is configured by a first semiconductor chip unit and a second semiconductor chip unit being integrally joined. The first semiconductor chip unit has a pixel region in which a pixel composed of a photodiode and a plurality of pixel transistors arranged in a line in plurality on a thin film silicon semiconductor layer, and is composed of a multilayer wiring layer, a color filter, and an on-chip micro-lens formed on a front surface of the semiconductor layer. The second semiconductor chip unit has a logic circuit for signal processing and a peripheral circuit unit including a control circuit formed on a silicon substrate, and is composed of a multilayer wiring layer on the semiconductor substrate. The logic circuit and the control circuit are configured by elements such as MOS transistors.

The first and second semiconductor chip units are joined such that the semiconductor layer of the first semiconductor chip unit and the multilayer wiring layer of the second semiconductor chip unit face each other. The first semiconductor chip unit and the second semiconductor chip unit are electrically connected by a similar connected conductor as that described above.

In the embodiment, any of the light shielding members described above is arranged between the pixel region and the peripheral circuit unit. The light shielding member is formed on the second semiconductor chip unit side in the vicinity of a joining surface of the first and second semiconductor chip units.

According to the front surface exposure type solid state imaging device according to the tenth embodiment, a light shielding member is arranged between the pixel region and the peripheral circuit unit that are arranged above and below in close proximity. By such a configuration, even if hot carrier light is emitted from the logic circuit of the peripheral circuit unit, the hot carrier light is shielded by the light shielding member and is not incident on the photodiodes PD of the pixel region above. Therefore, the hot carrier light being projected on the pixel region is avoided, and a solid state imaging device in which the image quality is thus improved is able to be provided. With regard to light emitted when the protection diode is acting is also suppressed from being incident on the photodiodes PD.

In the solid state imaging device of the embodiment, similarly to above, the pixel region is formed on the first semiconductor chip unit and the peripheral circuit unit is formed on the second semiconductor chip unit. Similarly to above, since it is a configuration in which the function of the pixel region and the functions of the peripheral circuit unit are formed and joined on different semiconductor chip units, the most appropriate process forming techniques are respectively able to be used for each of the pixel region and the peripheral circuit unit. Therefore, a high-performance solid state imaging device in which the functions of each of the pixel region and the logic circuit are able to be adequately demonstrated is able to be provided.

12. Eleventh Embodiment (Configuration Example of Electronic Apparatus)

The solid state imaging device according to the embodiments of the disclosure described above is able to be applied to an electronic apparatus such as, for example, a camera system such as a digital camera or a video camera, a mobile phone that has an imaging function, or other apparatuses including an imaging function.

Figure 17:
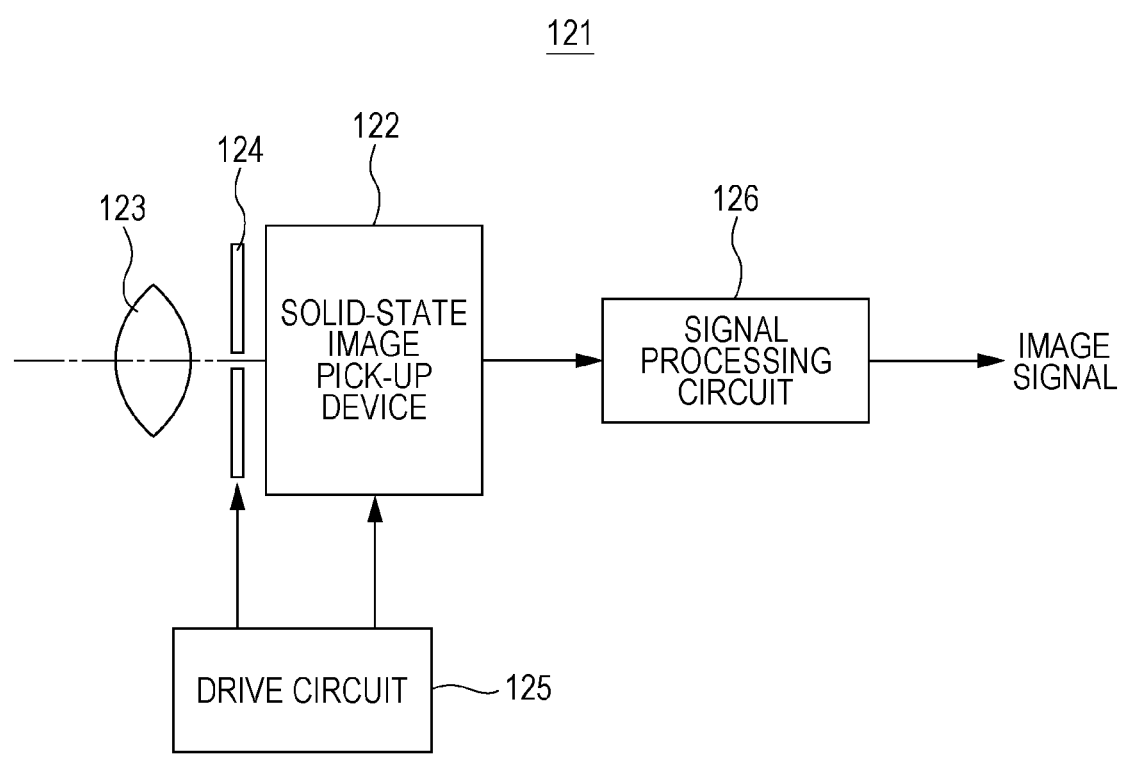
FIG. 17 is an outline configuration diagram that illustrates an electronic apparatus according to an eleventh embodiment of the disclosure.

An eleventh embodiment that is applied to a camera as one example of the electronic apparatus according to an embodiment of the disclosure is illustrated in FIG. 17. A camera according to the eleventh embodiment is an example of a video camera that is able to image still images or moving images. A camera 121 of the embodiment includes a solid state imaging device 122 and an optical system 123 that leads incident light to a light receiving sensor unit of the solid state imaging device 122. Further, the camera 121 includes a shutter device 124, a driving circuit 125 that drives the solid state imaging device 122, and a signal processing circuit 126 that processes output signals of the solid state imaging device 122.

Any of the solid state imaging devices of the embodiments described above is applied as the solid state imaging device 122. The optical system (optical lens) 123 forms imaging light (incident light) from a subject as an image on an imaging surface of the solid state imaging device 122. In so doing, signal charges are accumulated within the solid state imaging device 122 for a fixed period of time. The optical system 123 may be an optical lens system that is configured from a plurality of optical lenses. The shutter device 124 controls the exposure period and the shielding period of light to and from the solid state imaging device 122. The driving circuit 125 supplied a driving signal that controls a transfer action of the solid state imaging device 122 and a shutter action of the shutter device 124. Signal transfer of the solid state imaging device 122 is performed by the driving signal (timing signal) provided from the driving circuit 125. The signal processing circuit 126 performs various types of signal processing. An imaging signal on which a signal processing is performed is stored on a memory medium such as a memory, or is output on a monitor.

According to the electronic apparatus according to the eleventh embodiment, incidence of light such as hot carrier light from active elements such as the MOS transistors or the diodes of the peripheral circuit unit, when acting, to the photodiodes is able to be suppressed. It is therefore possible to provide an electronic apparatus with high image quality. For example, a camera in which the image quality is improved is able to be provided.

It should be understood by those skilled in the art that various modifications, combinations, sub-combinations and alterations may occur depending on design requirements and other factors insofar as they are within the scope of the appended claims or the equivalents thereof.

What is claimed is:

1. A solid state imaging device comprising:
a pixel region that is formed on a light incident side of a substrate and to which a plurality of pixels that include photoelectric conversion units is arranged;
a peripheral circuit unit that is formed in a lower portion in a substrate depth direction of the pixel region and that includes an active element; and
a light shielding member that is formed between the pixel region and the peripheral circuit unit, wherein the light shielding member shields light, emitted from the active element, from being incident on the photoelectric conversion units, and wherein the light shielding member includes at least one of tungsten (W), copper (Cu), titanium (Ti), titanium nitride (TiN), and carbon (C).

2. The solid state imaging device according to claim 1,
wherein the pixels are formed to include a photoelectric conversion unit and a plurality of pixel transistors, and
an active element of the peripheral circuit unit is formed by one or both of a MOS transistor and a diode.

3. The solid state imaging device according to claim 2,
wherein the substrate is configured by affixing a first semiconductor chip unit that includes a multilayer wiring layer and the pixel region with a second semiconductor chip unit that includes a multilayer wiring layer and the peripheral circuit unit,
wherein the peripheral circuit includes a logic circuit, and
the first semiconductor chip unit and the second semiconductor chip unit are electrically connected by a connected conductor that penetrates the first semiconductor chip.

4. The solid state imaging device according to claim 3,
wherein the first semiconductor chip unit and the second semiconductor chip unit are affixed with the multilayer wiring layer of each facing the other.

5. The solid state imaging device according to claim 1,
wherein the light shielding member is formed by a reflection and dispersion member that reflects and disperses light.

6. The solid state imaging device according to claim 1,
wherein the light shielding member is formed by a light absorbing member that absorbs light.

7. The solid state imaging device according to claim 1,
wherein the light shielding member is formed by a combination of a reflection and dispersion member that reflects and disperses light, and a light absorbing member that absorbs light.

8. The solid state imaging device according to claim 5,
wherein the reflection and dispersion member is formed by a single metallic film.

9. The solid state imaging device according to claim 5,
wherein the reflection and dispersion member is formed by a wiring of a plurality of layers, a dummy wiring of a plurality of layers, or a combination of a wiring and a dummy wiring of a plurality of layers of the multilayer wiring layer, each of which partially overlaps another.

10. The solid state imaging device according to claim 5,
wherein the reflection and dispersion member is formed by a combination of a single metallic film and wiring of a plurality of layers, dummy wiring of a plurality of layers, or a combination of wiring and dummy wiring of a plurality of layers of the multilayer wiring layer.

11. The solid state imaging device according to claim 6,
wherein the light absorbing member is formed of a single film using a semiconductor with a small band gap.

12. An electronic apparatus comprising:
a solid state imaging device;
an optical system that guides incident light to photoelectric conversion units of the solid state imaging device; and
a signal processing circuit that processes an output signal of the solid state imaging device,
wherein the solid state imaging device is configured by a solid state imaging device according to claim 1.

* * * * *